United States Patent
Hirabayashi

(10) Patent No.: US 7,056,644 B2
(45) Date of Patent: *Jun. 6, 2006

(54) PRODUCING METHOD OF PHOTOSENSITIVE PLANOGRAPHIC PRINTING PLATE AND PRINTING PLATE PRODUCED THEREBY

(75) Inventor: Kazuhiko Hirabayashi, Kanagawa (JP)

(73) Assignee: Konica Minolta Medical & Graphic, Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/828,081

(22) Filed: Apr. 20, 2004

(65) Prior Publication Data

US 2004/0219459 A1 Nov. 4, 2004

(30) Foreign Application Priority Data

Apr. 24, 2003 (JP) .............................. 2003-119577

(51) Int. Cl.
*G03F 7/031* (2006.01)

(52) U.S. Cl. ................ 430/302; 430/270.1; 430/278.1; 430/284.1; 430/286.1; 430/287.1

(58) Field of Classification Search ............. 430/270.1, 430/278.1, 281.1, 284.1, 286.1, 287.1, 302
See application file for complete search history.

(56) References Cited

U.S. PATENT DOCUMENTS

| 2001/0036598 A1* | 11/2001 | Shimada et al. ......... 430/281.1 |
| 2004/0005515 A1* | 1/2004 | Hirabayashi ............. 430/273.1 |
| 2004/0091816 A1* | 5/2004 | Matsumura et al. ..... 430/281.1 |

FOREIGN PATENT DOCUMENTS

| JP | 1-105238   | 4/1989 |
| JP | 2-127404   | 5/1990 |
| JP | 9-142049   | 6/1997 |
| JP | 10-37000   | 2/1998 |
| JP | 2001-183822 | 7/2001 |
| JP | 2001-209170 | 8/2001 |

OTHER PUBLICATIONS

* English Abstract for Japanese Patent Application 01-105238 dated Apr. 21, 1989.
** English Abstract for Japanese Patent Application 02-127404 dated May 16, 1990.
*** English Abstract for Japanese Patent Application 09-142049 dated Jun. 3, 1997.
****English Abstract for Japanese Patent Application 10-037000 dated Feb. 10, 1998.
*****English Abstract for Japanese Patent Application 2001-183822 dated Jul. 6, 2001.
******English Abstract for Japanese Patent Application 2001-209170 dated Aug. 3, 2001.

* cited by examiner

*Primary Examiner*—B. L. Gilliam
(74) *Attorney, Agent, or Firm*—Cantor Colburn LLP

(57) ABSTRACT

A method for producing a photosensitive planographic printing plate may comprise (i) carrying out electrolysis to an aluminum support in an aqueous solution of hydrochloric acid or nitric acid so as to provide the aluminum support with a roughened surface; (ii) coating a photosensitive composition on the roughed surface of the aluminum support to obtain a photosensitive layer, the photosensitive composition containing: (A) a monomer having an ethylenic double bond which is also polymerizable; (B) a photoinitiator composition containing an iron arene complex compound; and (C) a polymer binder, (iii) drying the photosensitive layer.

5 Claims, No Drawings

PRODUCING METHOD OF PHOTOSENSITIVE PLANOGRAPHIC PRINTING PLATE AND PRINTING PLATE PRODUCED THEREBY

TECHNICAL FIELD

This invention relates to a method for producing a photosensitive planographic printing plate (also called as a lithographic plate) and a photosensitive planographic printing plate produced by the method, and particularly to a photosensitive planographic printing plate which exhibits a high sensitivity and high printing durability as well as high linearity.

BACKGROUND

Generally, in a planographic printing plate called as a negative type, a planographic printing plate is prepared by curing the image portion after image exposure, followed by being subjected to a washing treatment with water and a finisher gum treatment after the unexposed portion having been removed by dissolution. In recent years, to obtain a high resolution and a high sharpness, studied has been a method in which a planographic printing plate is prepared by digital exposure employing a laser light based on image information followed by a development process. For example, it is a system in which a planographic printing plate is prepared by modulating an exposure light source according to image signals transmitted through a communication circuit or output signals from such as an electrophotographic plate making system and an image processing system and by performing exposure on a photosensitive material by means of direct scanning exposure.

However, there was a problem that spectral sensitization and sensitivity increase to match a wavelength of a laser light for digital exposure were difficult.

In recent years, as materials which are suitable to laser exposure and capable of being spectrally sensitized and sensitivity increased, a planographic printing plate material provided with a photopolymerizable photosensitive layer containing a photopolymerization initiator has come to be noted. Further sensitivity increase is required to shorten the recording time with respect to such plate materials for CTP (Computer to Plate) which record digital data with a laser light source. Heretofore, plate materials having high printing durability are desired in many printing applications as newspaper printing and commercial printing of such as advertisement.

There are proposed techniques (refer to, for example, patent literatures 1 and 2) in which a titanocene compound is utilized as a photopolymerization initiator to achieve sensitivity increase. However, sufficient sensitivity increase has not been achieved by only these techniques.

Further, for the purpose of sensitivity improvement, there have been proposed a technique (refer to, for example, patent literature 3) in which a monomer provided with a tertiary amino group in the structure (a monomer containing an addition polymerizable ethylenic double bond) and a trihalogenated methyl-s-triazine compound are utilized in combination, and a technique (refer to, for example, patent literature 4) in which a metalocene compound such as titanocene in addition to a monomer provided with a tertiary amino group in the structure (a monomer containing an addition polymerizable ethylenic double bond) and a trihalogenated methyl-s-triazine compound are utilized in combination.

Among these metalocene compounds, titanocene has a relatively high sensitivity and excellent printing durability, while a Fe arene complex compound has a problem of poor printing durability and has not been studied so much although it is cheaper compared to titanocene.

Further, it is necessary to improve adhesion between a photosensitive layer and a support to increase printing durability, and preferable is to coat a photosensitive layer after anodic oxidation for the purpose of improving adhesion, however, excessively strong adhesion caused a problem that the photosensitive layer of an unexposed portion cannot be peeled off or dissolved completely to generate ink smudge. Many patents have been applied with respect to roughening and anodic oxidation of an aluminum support (refer to, for example, patent literatures 5 and 6).

However, a detailed study has not been performed yet with respect to the relationship between the type a Fe allene complex compound, which is employed as a photopolymerization initiator, and a roughening treatment of an aluminum support.

[Patent Literature 1]   JP-A No. 2001-209170
(Hereinafter, JP-A refers to Japanese Patent Publication Open to Public Inspection)
[Patent Literature 2]   JP-A No. 2001-183822
[Patent Literature 3]   JP-A No. 1-105238
[Patent Literature 4]   JP-A No. 2-127404
[Patent Literature 5]   JP-A No. 10-37000
[Patent Literature 6]   JP-A No. 9-142049

SUMMARY

An object of this invention is to provide a method for producing a photosensitive planographic printing plate having a high sensitivity and high printing durability and a low manufacturing cost. Another object of the present invention is to provide a photosensitive planographic printing plate having a high sensitivity and high printing durability by using a specified producing method.

The above-described problems of a photosensitive planographic printing plate have been solved by the following structures.

1. An aspect of the present invention is a method for producing a photosensitive planographic printing plate. The production method is characterized by comprising the steps of:
    (i) carrying out electrolysis to an aluminum support in an aqueous solution of hydrochloric acid or nitric acid so as to provide the aluminum support with a roughened surface;
    (ii) coating a photosensitive composition on the roughed surface of the aluminum support to obtain a photosensitive layer, the photosensitive composition containing:
        (A) a monomer having an ethylenic double bond which is addition polymerizable;
        (B) a photoinitiator composition containing an iron arene complex compound; and
        (C) a polymer binder,
    (iii) drying the photosensitive layer,
        wherein a content of hydrochloric acid or nitric acid in the aqueous solution for electrolysis is 0.4 to 2.8 weight % based on the total weight of the aqueous solution; an electric current density applied during electrolysis is 30 to 100 A/dm$^2$; and a time period for electrolysis is 10 to 120 seconds.

2. Another aspect of the present invention is a production method of photosensitive planographic printing plate described in Item 1, wherein the monomer containing an addition polymerizable ethylenic double bond is a compound represented by General Formula (1) or General Formula (2).

General Formula (1)

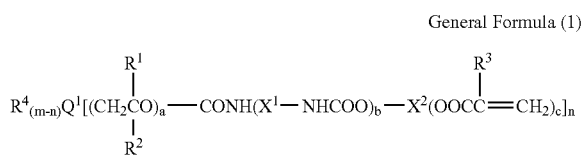

wherein, $Q^1$ is

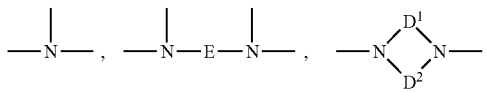

or —S—; $R^4$ is an alkyl group, a hydroxyalkyl group or an aryl group; $R^1$ and $R^2$ are a hydrogen atom, an alkyl group or an alkoxyalkyl group, respectively; $R^3$ is a hydrogen atom, a methyl group or an ethyl group; $X^1$ is a divalent group having 2–12 carbon atoms; $X^2$ is a divalent to tetravalent group or

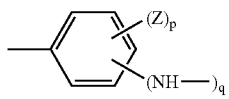

Z is an alkyl group, an alkenyl group, an aryl group, a halogen atom, an alkoxyl group or a heterocyclic group; p is an integer of 1–4; q is an integer of 1–3; and p+q≦5. $D^1$ and $D^2$ are a saturated hydrocarbon group having 1–5 carbon atoms, respectively; E is a saturated hydrocarbon group having 2–12 carbon atoms, an alicyclic compound having 5–7 ring members and not more than two N, O or S atoms are present as a ring member, an aromatic group having 6–12 carbon atoms, or heterocyclic aromatic group having a 5 or 6 member ring; a is 0 or an integer of 1–4; b is 0 or 1; c is an integer of 1–3; m is an integer of 2–4, which depends on the value of valence of $Q^1$; n is an integer of 1–m; and all the groups having the same definitions may be same as or different from each other.

General Formula (2)

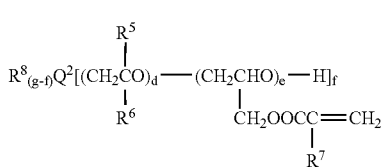

wherein, $Q^1$ is

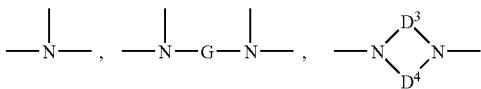

$R^8$ is an alkyl group, a hydroxyalkyl group or an aryl group; $R^5$ and $R^6$ are a hydrogen atom, an alkyl group or an alkoxyalkyl group, respectively; $R^7$ is a hydrogen atom, a methyl group or an ethyl group; $D^3$ and $D^4$ are a saturated hydrocarbon group having 1–5 carbon atoms, respectively; G is a saturated hydrocarbon group having 2–12 carbon atoms, an alicyclic compound having 5–7 ring members and not more than two N, O or S atoms are present in a ring member, an aromatic group having 6–12 carbon atoms, or heterocyclic aromatic group having a 5 or 6 member ring; d and e represent an integer of 1–4; g is an integer of 2–4 depending on the value of valence of $Q^2$; f is an integer of 1–g; and all the groups having the same definitions may be same as or different from each other.

3. A further aspect of the present invention is a production method of the photosensitive planographic printing plate described in Item 1 or 2, wherein the aforesaid photopolymerization initiator composition contains at least one type of a polyhalogen compound.

4. A further aspect of the present invention is a production method of the photosensitive planographic printing plate described in Item 3, wherein the aforesaid polyhalogen compound is at least one type of a compound selected from compounds represented by General Formulas (3)–(5), polyhaloacetylamide compounds or polyhalotriazine compounds.

General Formula (3)

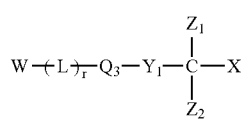

wherein, $Z^1$ and $Z^2$ each independently is a halogen atom, X is a hydrogen atom or an electron attractive group, $Y_1$ is —CO— group or —$SO_2$— group, $Q_3$ is arylene group or a divalent heterocyclic group, L is a linkage group, W is a carboxyl group or a salt thereof, a sulfo group or a salt thereof, a hydroxyl group, a quaternary ammonium group or a polyethylene oxy group. r is 0 or 1.

General Formula (4)

General Formula (4)

wherein, $Q_4$ is an alkyl group, an aryl group or a heterocyclic group, $X_1$ and $X_2$ each is a halogen atom, Z is a hydrogen atom or an electron attractive group. Y is —C(=O)—, —SO— or —$SO_2$— group. s is 0 or 1.

General Formula (5)

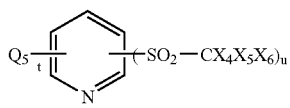

General Formula (5)

wherein, $Q_5$ is an alkyl group, an aryl group or a heterocyclic group, $X_4$, $X_5$ and $X_6$ each is a hydrogen atom or a halogen atom, however, at least one of $X_4$, $X_5$ and $X_6$ is a halogen atom. t is 0 or an integer of 1–4, and u is an integer of 1–5.

5. A further aspect of the present invention is a production method of the photosensitive planographic printing plate described any one of Items 1–4, wherein the aforesaid photopolymerization initiator composition contains at least one type of dye having a maximum absorption in a range of 350–600 nm.

6. A further aspect of the present invention is a photosensitive planographic printing plate prepared by the production method described in any of Items 1–5.

DESCRIPTION OF EXEMPLARY EMBODIMENTS

The photosensitive composition of the present invention contains: (A) a monomer containing an addition polymerizable ethylenic double bond; (B) a photopolymerization initiator composition and (C) a polymer binder, wherein (B) the photopolymerization initiator composition contains at least one type of an iron allene complex compound. A specific feature of the present invention is to use an aluminum support, on which the photosensitive composition is coated, is subjected, before being coated, to an electrolytic roughening treatment in a hydrochloric acid or nitric acid solution having a concentration of 0.4–2.8 weight % at an effective electric current density of 30–100 A/dm² for 10–120 seconds.

Each composition contained in a photosensitive composition of a photosensitive planographic printing plate of this invention will be explained.

(A) A Monomer Containing an Addition Polymerizable Ethylenic Double Bond:

A monomer containing an addition polymerizable ethylenic double bond is utilized in a photosensitive composition of a photosensitive layer (hereinafter, also simply referred to as a photosensitive layer) according to this invention.

As a monomer containing an addition polymerizable ethylenic double bond, utilized can be general radical polymerizable monomer series, poly-functional monomer series and poly-functional oligomer series, which are generally employed as an ultraviolet curable resin and provided with a plural number of addition polymerizable ethylenic double bonds in the molecule. The compounds are not limited, however, preferably include mono-functional acrylic ester series, for example, such as 2-ethylhexyl acrylate, 2-hydroxypropyl acrylate, glycerol acrylate, tetrahydroflufuryl acrylate, phenoxyethyl acrylate, nonylphenoxyethyl acrylate, tetrahydrofulufryloxyethyl acrylate, tetrahydrofulufryloxyhexanolide acrylate, acrylate of an ε-caprolactone adduct of 1,3-dioxane alcohol, 1,3-dioxolane acrylate, or methacrylic acid, itaconic acid crotonic acid and maleic acid esters in which acrylate thereof are replaced by methacrylate, itaconate, crotonate and maleate; bi-functional acrylic ester series, for example, such as ethyleneglycol diacrylate, triethyleneglycol diacrylate, pentaerithritol diacrylate, hydroquinone diacrylate, resorcine diacrylate, hexandiol diacrylate, neopentylglycol diacrylate, tripropyleneglycol diacrylate, diacrylate of hydroxypivalinic acid neopentylglycol, diacrylate of neopentylglycoladipate, diacrylate of an ε-caprolactone adduct of hydroxypivalinic acid neopentylglycol, 2-(2-hydroxy-1,1-dimethylethyl)-5-hydroxymethyl-5-ethyl-1,3-dioxane diacrylate, tricyclodecane dimethylolacrylate, an ε-caprolactone adduct of tricyclodecane dimethylolacrylate, diacrylate of diglycidyl ether of 1,6-hexanediol, or methacrylic acid, itaconic acid crotonic acid and maleic acid esters in which acrylate thereof are replaced by methacrylate, itaconate, crotonate and maleate; multi-functional acrylic acid esters, for example, such as trimethlolpropane triacrylate, ditrimethlolpropane tetraacrylate, trimethilolethane triacrylate, pentaerythritol triacrylate, pentaerythritol tetraacrylate, dipentaerythritol tetraacrylate, dipentaerythritol pentaacrylate, dipentaerythritol hexaacrylate, an ε-caprolactone adduct of dipentaerythritol hexaacrylate, pyrogallol triacrylate, propionic acid-dipentaerythritol triacrylate, propionic acid.dipentaerythritol tetraacrylate, hydroxypivalylaldehyde modified dimethylolpropane triacrylate, or methacrylic acid, itaconic acid crotonic acid and maleic acid esters in which acrylate thereof are replaced by methacrylate, itaconate, crotonate and maleate.

Further, pre-polymers also can be utilized similarly as described above. Pre-polymers include compounds described below, in addition to this, preferably utilized can be a pre-polymer in which acrylic acid or methacrylic acid is introduced into a oligomer having a suitable molecular weight to provide a photopolymerizing property. These pre-polymers may be utilized alone or in combination of two or more types, and by mixing with monomers and/or oligomers described above.

Prepolymers include polyester acrylate series in which (meth)acrylic acid is introduced into a polyester, for example, prepared by combining polybasic acids such as adipic acid, trimerit acid, maleic acid, phthalic acid, terephthalic acid, hymic acid, malonic acid, succinic acid, glutaric acid, itaconic acid, pyrromeric acid, fumaric acid, pymeric acid, sebasic asid, dodecanic acid and tetrahydrophthalic acid, and polyhydric alcohols such as ethylene glycol, propylene glycol, diethylene glycol, propylene oxide, 1,4-butanediol, triethylene glycol, tetraethylene glycol, polyethylene glycol, glycerin, trimethylol propane, pentaerythritol, sorbitol, 1,6-hexanediol, 1,2,6-hexanetriol; epoxy acrylate series, in which, for example, (meth)acrylic acid is introduced into an epoxy resin, such as bis-phenol A.epichlorhydrine.(meth)acrylic acid and phenolnobolac.epichlorhydrine.(meth)acrylic acid; urethane acrylate in which (meth)acrylic acid is introduced into an urethane resin, for example, such as ethyleneglycol.adipic acid.trilenediisocyanate.2-hydroxyethyl acrylate, polyethyleneglycol.trilenediisocyanate.2-hydroxyethyl acrylate, hydroxyethylphthalylmethacrylate.xylenediisocyanate, 1,2-polybutadieneglycol.trilenediisocyanate.2-hydroxyethyl acrylate, trimethylolpropane.propyleneglycol.triisodiisocyanate.2-hydroxyethyl acrylate; silicone resin acrylate series, for example, such as polysilixane acrylate and polysiloxane.diasocyanate.2-hydroxyethyl acrylate; in addition, alkyd modified acrylate series in which a (meth)acryloyl group is introduced into oil modified alkyd resin; and spiran resin acrylate series.

In a photosensitive composition of a photo-polymerizable photosensitive layer of this invention, contained can be an addition polymerizable oligomer and prepolymer provided with a monomer such as phosphazene monomer, triethylene glycol, isocyanuric acid EO(ethyleneoxide) modified diacrylate, isocyanuric acid EO(ethyleneoxide) modified triacrylate, dimethylol tricyclodecane diacrylate, trimethylolpropane acrylic acid benzoic ester, alkylene glycol type acrylic acid modified acrylate and urethane modified acrylate and a constitutinal unite comprising thereof.

Further, an ethylenic monomer which can be incorporated in this invention includes phosphoric acid ester compound containing at least one (meth)acryloyl group. The compound is one in which a part of hydroxyl groups of phosphoric acid is esterified and is not specifically limited provided having an acryloyl group.

In addition to these, listed are compounds such as described in JP-A Nos. 58-212994, 61-6649, 62-46688, 62-48589, 62-173295, 62-187092, 63-67189 and 1-244891. Further, also preferably utilized can be compounds such as described in pages 286–294, "Chemical Product of 11290", published by Kagaku Kogyo Nipposha, and in pages 11–65, "UV EB Curing Handbook (starting materials)", published by Kobunshi Publishing Association. Among these, compounds having two or more acrylic groups or methacrylic groups in the molecule are preferably utilized in this invention, and the molecular weight is preferably not more than 10,000 and more preferably not more than 5,000.

Further, in a photosensitive composition of a photopolymerizable photosensitive layer of this invention, preferably utilized is a monomer provided with an addition polymerizable ethylenic double bond containing a tertiary amino group in the molecule as a tertiary amine monomer. There is specifically no structural limitation, however, preferably utilized is a tertiary amine compound having a hydroxyl group modified with such as glycidyl methacrylate, methacrylic acid chloride and acrylic acid chloride. Specifically, polymerizable compounds described in JP-A Nos. 1-165613, 1-203413 and 1-197213.

Further, in this invention, preferably utilized is a reaction product of polyhydric alcohol having a tertiary amine group in the molecule as a tertiary amine monomer, a diisocyanate compound and a compound having a hydroxyl group and an addition polymerizable ethylenic double bond in the molecule.

Herein, polyhydric alcohol having a tertiary amine group in the molecule includes such as triethanolamine, N-methyl diethanolamine, N-ethyl diethanolamine, N-n-butyl diethanolamine, N-tert.-butylethanol amine, N,N-di(hydroxyethyl)aniline, N,N,N',N'-tetra-2-hydroxypropylethylene diamine, N,N-bis(2-hydroxypropyl)aniline, allyldiethanolamine, 3-(dimethylamino)-1,2-propanediol, 3-diethylamino-1,2-propanediol, N,N-di(n-propyl)amino-2,3-propanediol, N,N-di(iso-propyl)amino-2,3-propanediol and 3-(N-methyl-N-benzylamino)-1,2-propanediol, however is not limited thereto.

A diisocyanate compound includes such as butane-1,4-diisocyanate, hexane-1,6-diisocyanate, 2-methylpentane-1,5-diisocyanate, octane-1,8-diisocyanate, 1,3-diisocyanatemethyl-cyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, trilene-2,4-diisocyanate, trilene-2,5-diisocyanate, trilene-2,6-diisocyanate, 1,3-di(isocyanatomethyl)benzene and 1,3-bis(1-isocyanato-1-methylethyl)benzene, however, is not limited thereto.

A compound having a hydroxyl group and an addition polymerizable ethylenic double bond in the molecule includes compounds such as MH-1 to MH-13 described below, however is not limited thereto.

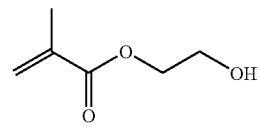

MH-1

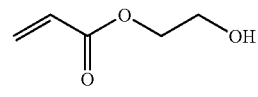

MH-2

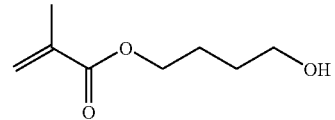

MH-3

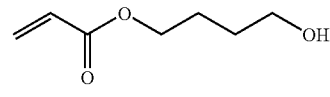

MH-4

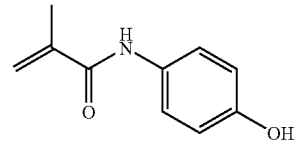

MH-5

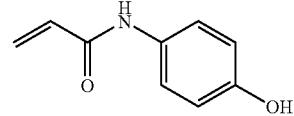

MH-6

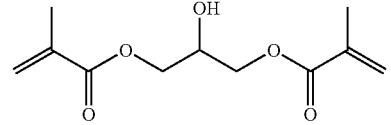

MH-7

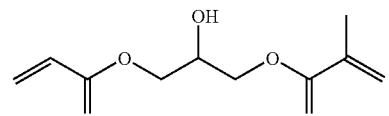

MH-8

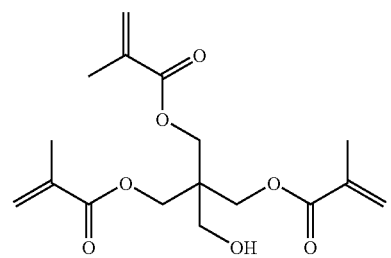

MH-9

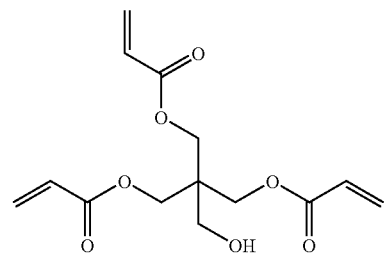

MH-10

-continued

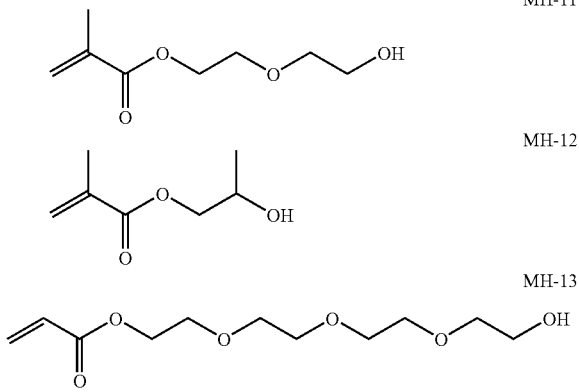

MH-11

MH-12

MH-13

Preferably, listed are 2-hydroxyethyl methacrylate (MH-1), 2-hydroxyethyl acrylate (MH-2), 4-hydroxybutyl acrylate (MH-4), 2-hydroxypropylene-1,3-dimethacrylate (MH-7) and 2-hydroxsspropylene-1-methacrylate-3-acrylate (MH-8).

These reactions can be performed in a similar manner to a method to synthesize urethane acrylate by a reaction of an ordinary diol compound, a diisocyanate compound and an acrylate compound containing a hydroxyl group.

Further, specific examples of these reaction products of polyhydric alcohol having a tertiary amine group in the molecule as a tertiary amine monomer, a diisocyanate compound and a compound, having a hydroxyl group and an addition polymerizable ethylenic double bond in the molecule, are shown below.

M-1: A reaction product of triethanolamine (1 mole), hexane-1,6-diisocyanate (3 moles) and 2-hydroxyethyl methacrylate (3 moles)

M-2: A reaction product of triethanolamine (1 mole), isophorone diisocyanate (3 moles) and 2-hydroxyethyl acrylate (3 moles)

M-3: A reaction product of N-n-butyl diethanolamine (1 mole), 1,3-bis(1-isocyanato-1-methylethyl)benzene (2 moles) and 2-hydroxypropylene-1-methacrylate-3-acrylate (2 moles)

M-4: A reaction product of N-n-butyl ethanolamine (1 mole), 1,3-di(isocyanatomethyl)benzene (2 moles) and 2-hydroxypropylene-1-methacrylate-3-acrylate (2 moles)

M-5: A reaction product of N-methyl diethanolamine (1 mole), trilene-2,4-diisocyanate (2 moles) and 2-hydroxypropylene-1,3-dimethacrylate (2 moles)

In this invention, monomers containing an addition polymerizable ethylenic double bond are specifically preferably compounds represented by general formula (1) or (2) described above.

In the following, compounds represented by aforesaid general formula (1) will be explained.

Alkyl groups represented by $R^4$ in general formula (1) include, for example, such as a methyl group, an ethyl group, a propyl group, a butyl group, a pentyl group, an iso-pentyl group, a 2-ethylhexyl group, an octyl group, a decyl group, an undecyl group, a n-dodecyl group, a n-tetradecyl group, a n-pentadecyl group, a n-hexadecyl group, a n-heptadecyl group, a n-octadecyl group and a n-docosadecyl group. Hydroxyalkyl groups represented by $R^4$ include such as a hydroxymethyl group, a hydroxyethyl group, a hydroxypropyl group and a hydroxypentyl group. Aryl groups represented by $R^4$ include, for example, such as a phenyl group and a naphthyl group.

Aryl groups represented by $R^1$ and $R^2$ in general formula (4) have the same definition as the alkyl groups represented by $R^4$ described above. Alkoxyalkyl groups represented by $R^1$ and $R^2$ include such as a methoxymethyl group, a methoxyethyl group, an ethoxymethyl group and a propoxyethyl group.

Divalent groups having 2–12 carbon atoms represented by $X^1$ in general formula (1) include, for example, such as a saturated hydrocarbon group and an arylene group. $X^1$ is preferably an arylene group.

Saturated hydrocarbon groups having 2–12 carbon atoms represented by $X^1$ include, for example, chain saturated hydrocarbon groups such as an ethylene group, a trimethylene group, a tetramethylene group, a propylene group, an ethylethylene group, a pentamethylene group, a hexamethylene group, a heptamethylene group, an octamethylene group, a nonamethylene group, a decamethylene group, an undecamethylene group and a dodecamethylene group; and cyclic saturated hydrocarbon groups such as a cyclohexylene group (for example, 1,6-cyclohexanediyl) and a cyclopentylene group (for example, 1,5-cyclopentanediyl). In this invention, saturated hydrocarbon groups represented by $X^1$ are preferably a cyclic saturated hydrocarbon group. Arylene groups represented by $X^1$ include, for example, such as a phenylene group and a naphthylene group.

In general formula (1), as divalent groups represented by $X^2$ utilized can be a saturated hydrocarbon group and an arylene group listed as divalent groups represented by aforesaid $X^1$ having 2–12 carbon atoms, however, the aforesaid saturated hydrocarbon group up to five methylene groups of which are substituted by oxygen atoms can be further utilized.

In general formula (1), a trivalent group represented by $X^2$ is a group in which one connecting group is further attached to the divalent groups represented by aforesaid $X^2$ (such as a saturated hydrocarbon group and an arylene group), and includes, for example, such as an ethanetriyl group, a propanetriyl group, a butanetriyl group, a pentanetriyl group, a hexanetriyl group, a heptanetriyl group, an octanetriyl group, a nonanetriyl group, a decanetriyl group, an undecanetriyl group, a dodecanetriyl group, a cyclohexanetriyl group, a cyclopentanetriyl group, a benzenetriyl group and a naphthalenetriyl group.

In general formula (1), a tetravalent group represented by $X^2$ is a group in which one connecting group is further attached to the trivalent groups represented by aforesaid $X^2$, and includes, for example, such as a propanediylidene group, a 1,3-propanediyl-2-ylidene group, a butanediylidene group, a pentadiylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group and a naphthalenetetrayl group.

In $X^2$ of general formula (1), Z is an alkyl group, an alkenyl group, an aryl group, a halogen atom, an alkoxy group or a heterocyclic group. Alkyl groups represented by Z include, for example, such as a methyl group, an ethyl group, a propyl group, a butyl group, a pentyl group, an iso-pentyl group, a 2-ethylhexyl group, an octyl group and a decyl group. Alkenyl groups represented by Z include, for example, such as a 2-propenyl group, a 3-butenyl group, a 1-methyl-3-propenyl group, a 3-pentenyl group, a 1-methyl-3-butenyl group and a 4-hexenyl group. Aryl groups represented by Z include, for example, such as a phenyl group, a m-chlorophenyl group, a p-tolyl group and naphthyl group. Halogen atoms represented by Z include such as a-fluorine atom, a chlorine atom, a bromine atom and an iodine atom. Alkoxy groups represented by Z include, for example, such as a methoxy group, an ethoxy group, a propoxy group and a butoxy group. Heterocyclic groups represented by Z include, for example, such as pyridyl group, a pyrrolyl group, a 2-methylpyrrolyl group, an indolyl group, an imidazolyl group, a furyl group, a thiazolyl group and a pyrimidinyl group.

In general formula (1), saturated hydrocarbon groups represented by $D^1$ and $D^2$ having 1–5 carbon atoms include such as a methylene group, a trimethylene group, a tetramethylene group, a propylene group, a ethylethylene group, a pentamethylene group and a cyclopentylene group.

In general formula (1), saturated hydrocarbon groups represented by E having 2–12 carbon atoms have the same definition as the divalent groups represented by $X^1$ having 2–12 carbon atoms.

In general formula (1), cycloaliphatic groups represented by E having 5–7 ring members as well as including N, O or S atoms of up to two as the ring member include, for example, such as a tetrahydrofurane ring, a pyrrolidine ring, a pyrazolone ring, an imidazoline ring, an oxazoline ring, a thiazoline ring, a pyridazine ring, a pyrane ring, a thiophene ring, an isooxazoline ring, a pyrroline ring, an imidazoline ring, an imidazolidine ring, a pyrazolidine ring, a pyrazoline ring, a piperidine ring, a piperazine ring and a morpholine ring.

In general formula (1), aromatic groups represented by E having 6–12 carbon atoms include, for example, such as phenylene group and naphthylene group.

In general formula (1), heterocyclic rings of heterocyclic aromatic groups represented by E having a 5- or 6-member ring include such as a furan ring, a pyrrole ring, a pyrrazole ring, an imidazole ring, an oxazole ring, a thiazole ring, a 1,2,3-oxazole ring, a 1,2,3-triazole ring, a 1,2,4-triazole ring, 1,3,4-thiazole ring, a pyridine ring, a pyridazine ring, a pyrimidine ring, a pyrazine ring, a s-triazine ring, a benzofuran ring, an indole ring, a benzothiophene ring, a benzimidazole ring, a benzothiazole ring, a purine ring, a quinoline ring and an iso-quinoline ring.

Herein, each substituent represented by general formula (1) described above may be further provided with a substituent.

In general formula (1), $Q^1$ is preferably provided with >N— and $X^1$ with an aromatic ring; and $X^1$ is more preferably provided with a structure such as 4-12–4-15 in specific examples listed below derived from trilene diisocyanate and furthermore preferably a structure such as 4-16–4-20 derived from tetramethylxylene diisocyanate.

Compounds represented by general formula (1) can be synthesized in reference to a method well known in the art, for example, in reference to a method described in such as Japanese Patent No. 2509288.

In the following, listed are specific examples of compounds represented by general formula (1), however, this invention is not limited thereto.

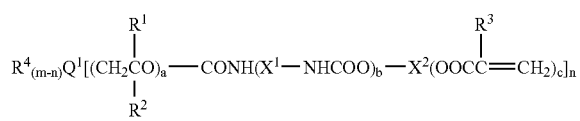

$$R^4{}_{(m-n)}Q^1[(CH_2CO)_a\!\!-\!\!\overset{\underset{\displaystyle R^2}{\displaystyle R^1|}}{C}ONH(X^1\!\!-\!\!NHCOO)_b\!-\!X^2(OOC\overset{\displaystyle R^3}{C}\!\!=\!\!CH_2)_c]_n$$

| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
| 1-1 | — | —N⟨ | 3 | 1 | H | H | 0 | — | $C_2H_4$ | 1 | $CH_3$ | 3 |
| 1-2 | — | —N⟨ | 3 | 1 | $CH_3$ | H | 0 | — | $C_2H_4$ | 1 | $CH_3$ | 3 |
| 1-3 | $C_2H_4OH$ | —N⟨ | 3 | 1 | H | H | 0 | — | $C_2H_4$ | 1 | $CH_3$ | 2 |
| 1-4 | — | —N⟨ | 3 | 1 | H | H | 1 | *1 | $C_2H_4$ | 1 | $CH_3$ | 3 |
| 1-5 | — | ⟩NCH$_2$CH$_2$N⟨ | 4 | 1 | H | H | 0 | — | $C_2H_4$ | 1 | $CH_3$ | 4 |
| 1-6 | — | ⟩NCH$_2$CH$_2$N⟨ | 4 | 1 | $CH_3$ | H | 0 | — | $C_2H_4$ | 1 | $CH_3$ | 4 |

-continued
| | | | | | | | | | | | |
|---|---|---|---|---|---|---|---|---|---|---|---|
| 1-7 | — | —N(CH₃)₂ group | 3 | 1 | H | H | 0 | — | $C_3H_6$ | 1 | $CH_3$ | 3 |
| 1-8 | — | $NCH_2CH_2N$ (tetramethyl) | 4 | 1 | H | H | 0 | — | $C_3H_6$ | 1 | $CH_3$ | 4 |
| 1-9 | — | —N(CH₃)₂ group | 3 | 1 | H | H | 0 | — | $C_2H_4$ | 1 | H | 3 |
| 1-10 | — | $NCH_2CH_2N$ (tetramethyl) | 4 | 1 | H | H | 0 | — | $C_2H_4$ | 1 | H | 4 |
| 1-11 | — | —S— | 2 | 1 | H | H | 0 | — | $C_2H_4$ | 1 | $CH_3$ | 2 |
*1: 2,2,4-trimethylhexamethylene
1-12
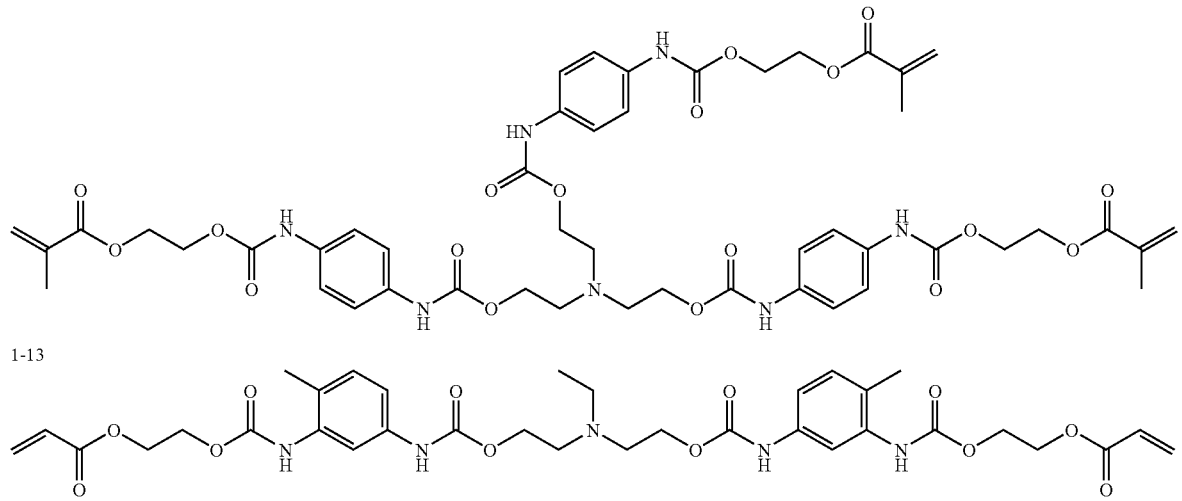
1-13
1-14
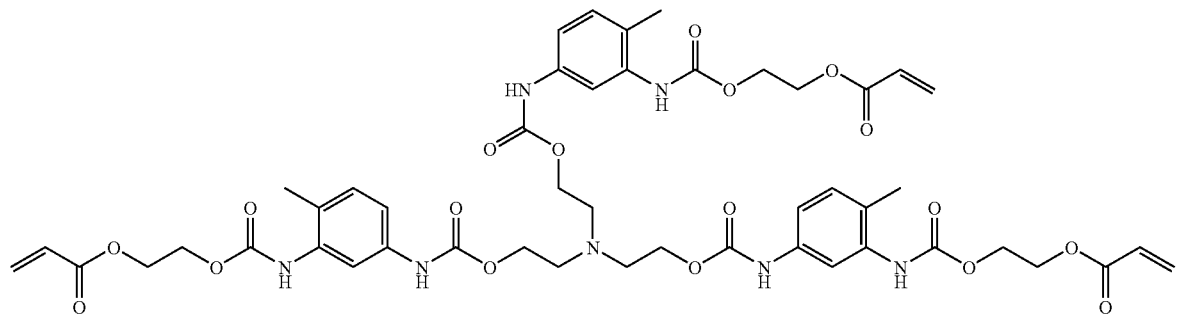

-continued
1-15
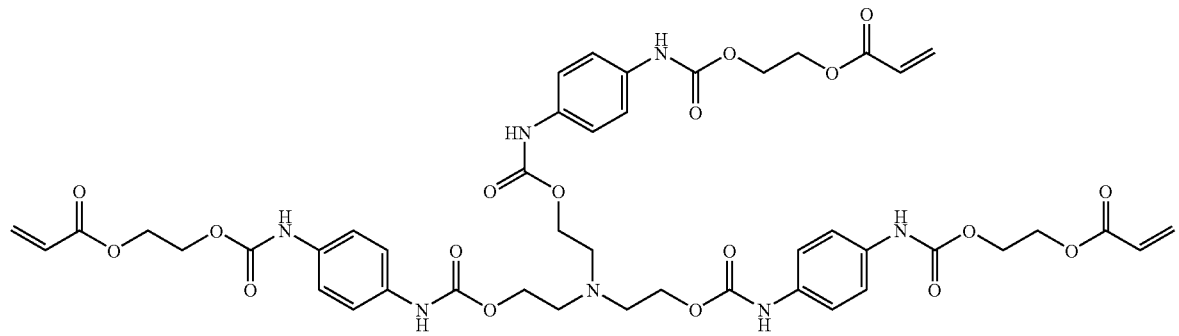
1-16
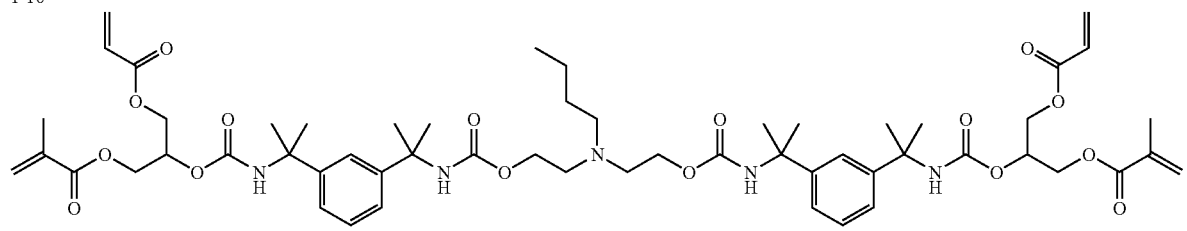
1-17
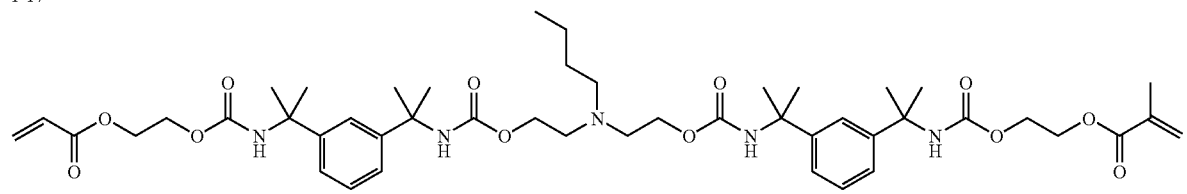
1-18
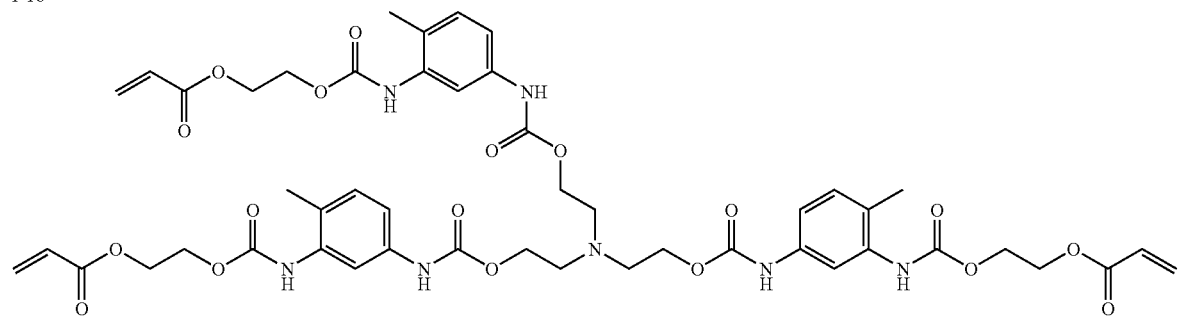
1-19
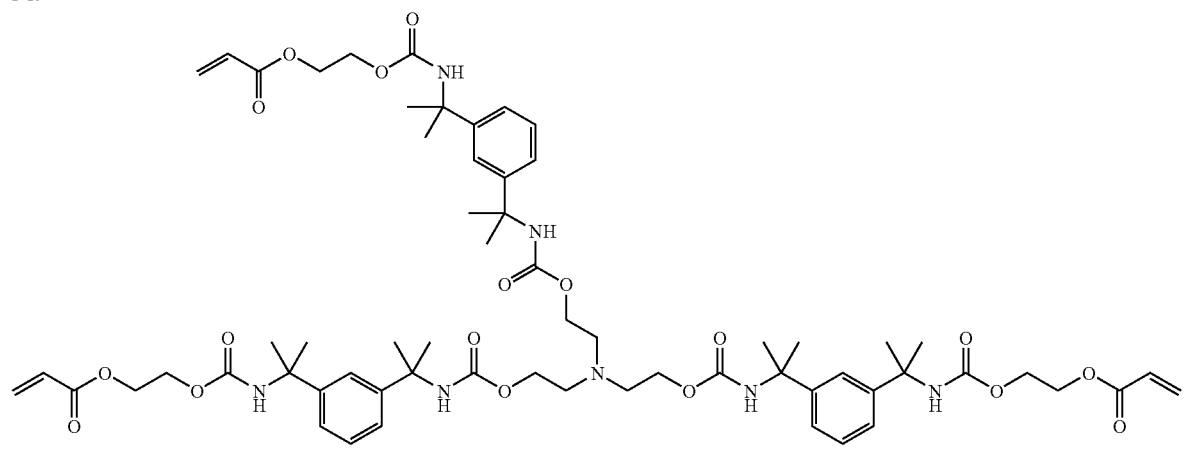

-continued 1-20

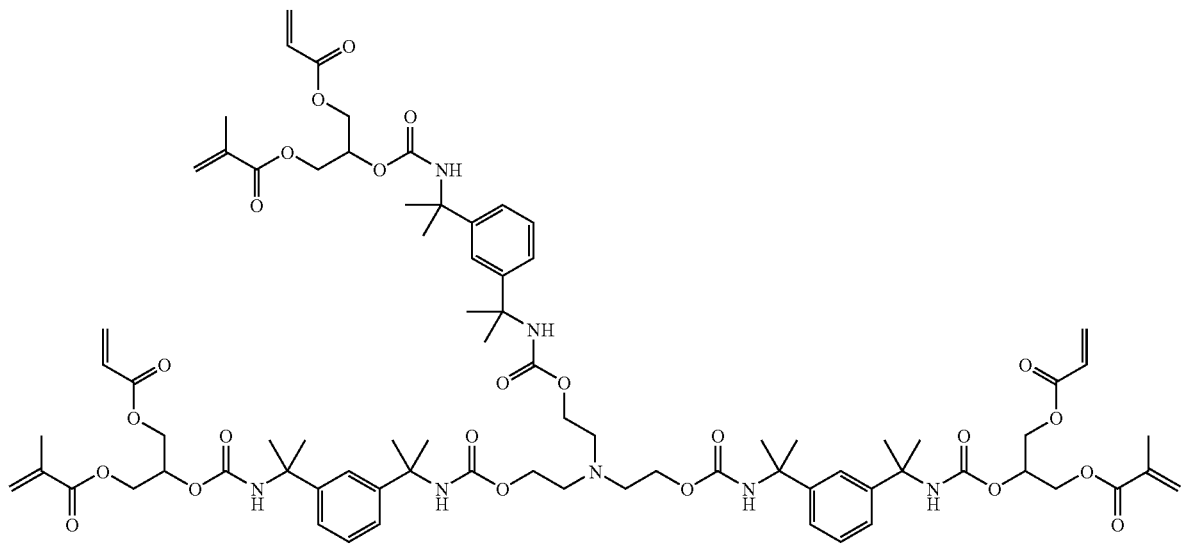

Next, compounds represented by aforesaid general formula (2) will be explained.

In general formula (2), $R^8$ may be different from each other when (g–f) is not less than two. Compounds, g and f of which are the same value, are preferred. When $R^8$ is an alkyl group or a hydroxyalkyl group, the carbon number is preferably 2–8 and more preferably 2–4. When $R^8$ is an aryl group, it is preferably monocyclic or bicyclic and more preferably monocyclic, in addition to this, it may be substituted by an alkyl group or alkoxy group having a carbon number of up to five, or a halogen atom. When $R^5$ and $R^6$ are an alkyl group or an alkoxy group, the carbon number is preferably 1–5. $R^7$ is preferably a methyl group.

$D^3$ and $D^4$ may be same or different, and are preferably form a saturated heterocyclic ring of 6-member together with two nitrogen atoms.

G is preferably has 2–6 carbon atoms in the case of a saturated hydrocarbon, preferably a phenylene group in the case of an aromatic group, preferably cyclohexylene group in the case of cyclic aliphatic group and preferably a 5- or 6-member ring containing a nitrogen atom or a sulfur atom in the case of a heterocyclic aromatic group.

To prepare compounds represented by general formula (2), glycidyl acrylate or alkyl acrylate is reacted with hydroxyalkylamine in the case of $Q^2$ being >N— and f and g being a same value. Other compounds can be prepared in a similar manner.

Specific examples of the compounds represented by general formula (2) are shown below.

$$R^8_{(g-f)}Q^2[(CH_2\underset{\underset{R^6}{|}}{\overset{\overset{R^5}{|}}{C}}O)_d\text{—}(CH_2CHO)_e\text{—}H]_f$$
$$\underset{\underset{R^7}{|}}{\overset{|}{CH_2OOCC}}=CH_2$$

| Compound No. | $R^8$ | $Q^2$ | g | d | $R^5$ | $R^6$ | e | $R^7$ | f |
|---|---|---|---|---|---|---|---|---|---|
| 2-1 | — | —N< | 3 | 1 | H | H | 1 | CH₃ | 3 |
| 2-2 | — | —N< | 3 | 1 | CH₃ | H | 1 | CH₃ | 3 |
| 2-3 | CH₂CH₂OH | —N< | 3 | 1 | H | H | 1 | CH₃ | 2 |

-continued

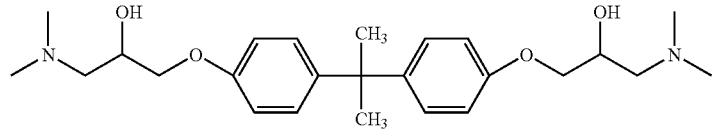

| Compound No. | $R^8$ | $Q^2$ | g | d | $R^5$ | $R^6$ | e | $R^7$ | f |
|---|---|---|---|---|---|---|---|---|---|
| 2-4 | — | —N(/\) | 3 | 1 | $CH_3$ | H | 1 | H | 3 |
| 2-5 | — | \N–CH$_2$CH$_2$–N/ | 4 | 1 | H | H | 1 | $CH_3$ | 4 |
| 2-6 | — | \N–CH$_2$CH$_2$–N/ | 4 | 1 | $CH_3$ | H | 1 | $CH_3$ | 4 |
| 2-7 | $C_6H_5$ | —N(/\) | 3 | 1 | H | H | 1 | H | 2 |
| 2-8 | — | \N–CH$_2$CH$_2$–N/ | 4 | 1 | $CH_3$ | H | 1 | H | 4 |
| 2-9 | — | —N(/\) | 3 | 1 | H | H | 1 | H | 3 |
| 2-10 | — | \N–CH$_2$CH$_2$–N/ | 4 | 1 | H | H | 1 | H | 4 |
| 2-11 | — | —S— | 2 | 1 | H | H | 1 | $CH_3$ | 2 |
| 2-12 | — | *2 | 4 | 1 | H | H | 1 | $CH_3$ | 4 |

*2

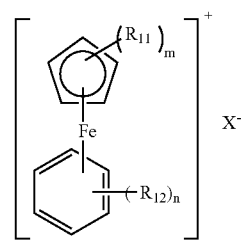

A content of a monomer containing an addition polymerizable ethylenic double bond according to this invention is preferably 30–70 weight % and more preferably 40–60 weight %, based on the non-volatile component of a photo-polymerizable photosensitive layer.

<Iron Arene Complex Compound>

Next, an iron arene complex compound contained in a photo-polymerization initiator composition of this invention will be explained.

The iron arene complex compounds include the compounds described in JP-A No. 59-219307, however, are typically compounds represented by general formula (F) described below.

General Formula (F)

$$\left[ \underset{\underset{\phantom{Fe}}{\bigcirc(R_{12})_n}}{\overset{(R_{11})_m}{\bigcirc}} Fe \right]^+ X^-$$

In the formula, $R^{11}$ and $R^{12}$ are a same group or different groups, being selected from alkyl groups of $C_1$–$C_{12}$, alkynyl groups of $C_2$–$C_{12}$, alkoxy groups of $C_1$–$C_8$, a cyano group, an alkylthio group, a phenoxy group, a monocarboxylic acid or ester groups thereof of $C_2$–$C_6$, alkanoyl groups of $C_2$–$C_5$, an ammonium salt, a pyridinium group, a nitro group, an alkylsulfinyl group, an alkylsulfonyl group, a sulfamoyl group and halogen atoms, and $R_{12}$ may form a condensed polycyclic compound with a benzene ring. X is $BF_4$, $PF_6$, $AsF_6$, $SbF_6$, $FeCl_4$, $SNCl_6$, $SbCl_6$ or $BiCL_6$. m is a positive integer of 1–4. n is a positive integer of 1–5.

Specific examples of iron arene complex compounds represented by general formula (F) are shown below:

Fe-1: (η6-benzene) (η5-cyclopentadienyl) iron(2) hexafluorophosphate
Fe-2: (η6-toluene) (η5-cyclopentadienyl) iron(2) hexafluorophosphate
Fe-3: (η6-cumene) (η5-cyclopentadienyl) iron(2) hexafluorophosphate
Fe-4: (η6-benzene) (η5-cyclopentadienyl) iron(2) hexafluoroarsenate
Fe-5: (η6-benzene) (η5-cyclopentadienyl) iron(2) tetrafluoroborate
Fe-6: (η6-naphthalene) (η5-cyclopentadienyl) iron(2) hexafluorophosphate
Fe-7: (η6-anthrathene) (η5-cyclopentadienyl) iron(2) hexafluorophosphate
Fe-8: (η6-pyrene) (η5-cyclopentadienyl) iron(2) hexafluorophosphate
Fe-9: (η6-benzene) (η5-cyanocyclopentadienyl) iron(2) hexafluorophosphate
Fe-10: (η6-toluene) (η5-acetylcyclopentadienyl) iron(2) hexafluorophosphate
Fe-11: (η6-cumene) (η5-cyclopentadienyl) iron(2) tetrafluoroborate
Fe-12: (η6-benzene) (η5-carboethoxycyclohexadienyl) iron(2) hexafluorophosphate
Fe-13: (η6-benzene) (η5-1,3-dichlorocyclopentadienyl) iron(2) hexafluorophosphate
Fe-14: (η6-cyanobenzene) (η5-cyclohexadienyl) iron(2) hexafluorophosphate
Fe-15: (η6-acetophenone) (η5-cyclohexadienyl) iron(2) hexafluorophosphate
Fe-16: (η6-methylbenzoate) (η5-cyclopentadienyl) iron (2) tetrafluorophosphate
Fe-17: (η6-benzenesulfonamide) (η5-cyclopentadienyl) iron(2) tetrafluoroborate
Fe-18: (η6-benzamide) (η5-cyclopentadienyl) iron(2) hexafluorophosphate
Fe-19: (η6-cyanobenzene) (η5-cyanocyclopentadienyl) iron(2) hexafluorophosphate
Fe-20: (η6-chloronaphthalene) (η5-cyclopentadienyl) iron(2) hexafluorophosphate
Fe-21: (η6-anthrathene) (η5-cyanocyclopentadienyl) iron (2) hexafluorophosphate
Fe-22: (η6-chlorobenzene) (η5-cyclopentadienyl) iron(2) hexafluorophosphate
Fe-23: (η6-chlorobenzene) (η5-cyclopentadienyl) iron(2) tetrafluoroborate These compounds can be synthesized by a method described in Dokl. Akd. Nauk SSSR 149 615 (1963).

An addition amount of an iron arene complex compound is preferably 0.1–15 weight %, more preferably 1–15 weight % and furthermore preferably 1.5–10 weight %, per the nonvolatile component of a photopolymerizable photosensitive layer.

In a photopolymerizable photosensitive layer of this invention, preferably contained is a polyhalogen compound as a photopolymerization initiator composition. Polyhalogen compounds include, for example, such as those represented by aforesaid general formula (3)–(5). Typical examples of compounds represented by aforesaid general formula (3)–(5) are listed below, however this invention is not limited thereto.

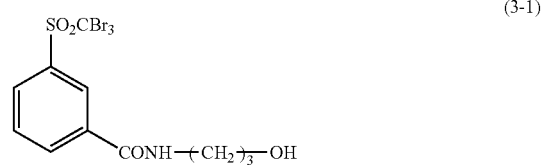

(3-1)

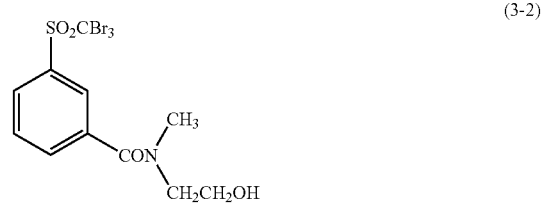

(3-2)

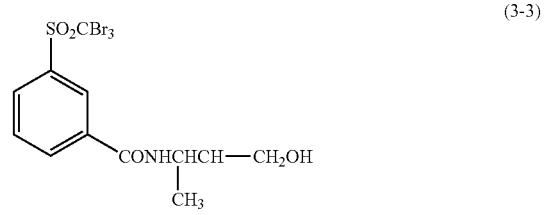

(3-3)

(3-4)

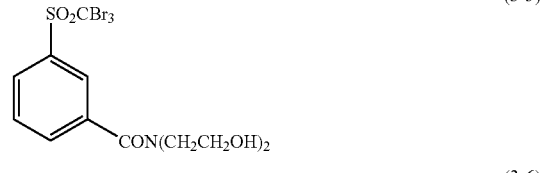

(3-5)

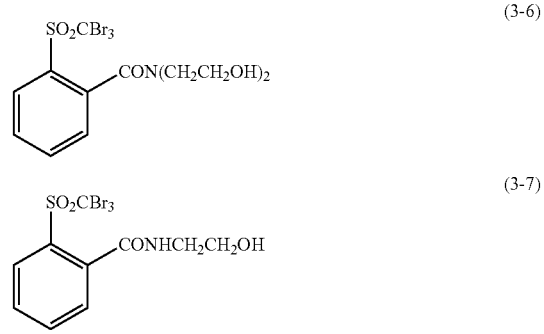

(3-6)

(3-7)

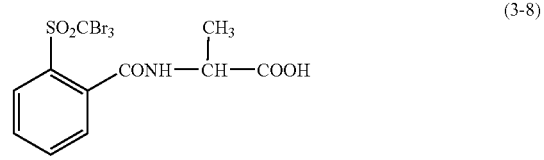

(3-8)

-continued
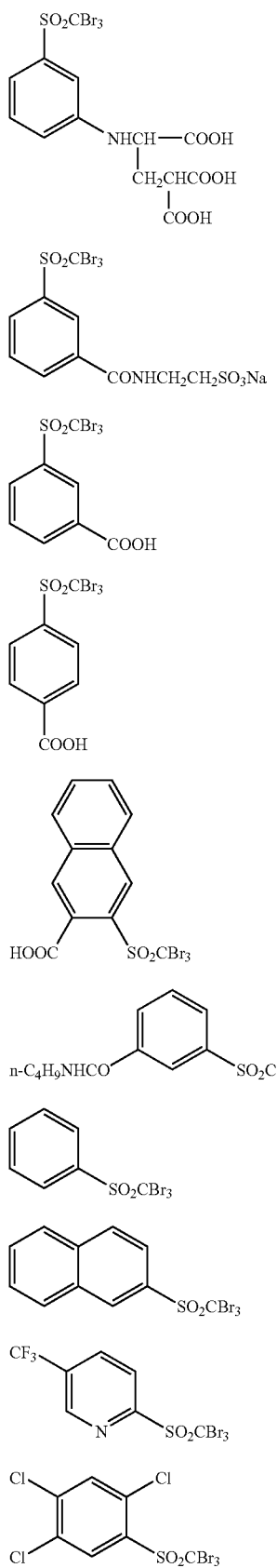
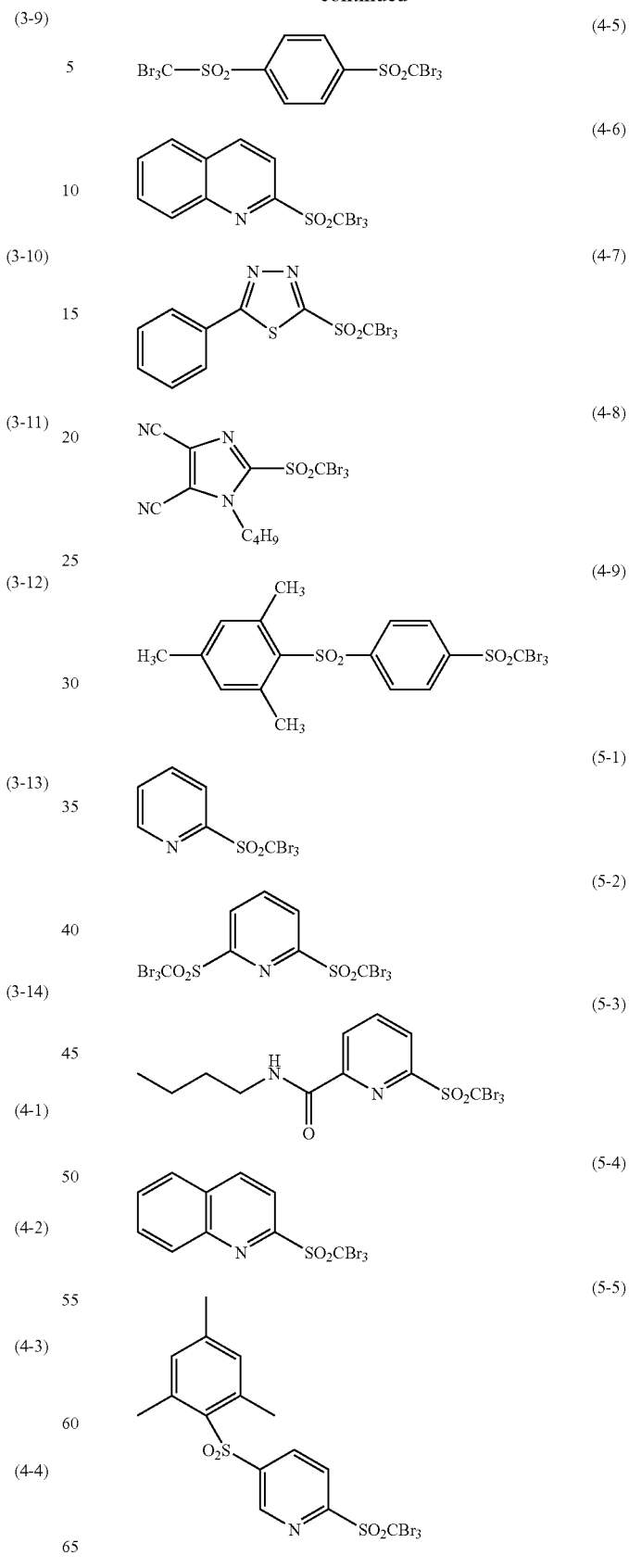

-continued (5-6) 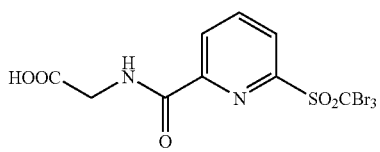

(5-7) 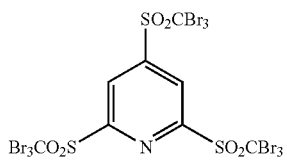

(5-8) 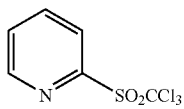

(5-9) 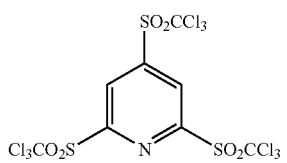

(5-10) 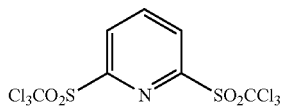

(5-11) 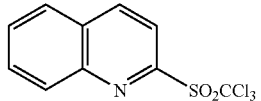

Further, a polyhalogen compound contained in a photopolymerization initiator composition of this invention is preferably a polyhaloacetyl compound and more preferably a triacetylamide compound. Polyhaloacetyl compounds include those represented by following general formula (6) and more preferably those represented by following general formula (7).

$$R^{11}-C(X^{10})_2-(C=O)-R^{12} \qquad \text{General Formula (6)}$$

wherein, $X^{10}$ is a chlorine atom or a bromine atom. $R^{11}$ is a hydrogen atom, a chlorine atom, a bromine atom, an alkyl group, an aryl group, an acyl group, an alkylsulfonyl group, an arylsulfonyl group or a cyano group. R12 is a monovalent substituent. Further, $R^{11}$ and $R^{12}$ may bond to form a ring.

$$C(X^{11})_3-(C=O)-Y^{10}-R^{12} \qquad \text{General Formula (7)}$$

wherein, $X^{11}$ is a chlorine atom or a bromine atom. $R^{13}$ is a monovalent substituent. $Y^{10}$ is —O— or —$NR^{14}$—. $R^{14}$ is a hydrogen atom or an alkyl group. Further, $R^{13}$ and $R^{14}$ may bond to form a ring.

Typical specific examples (BR1–BR76) of the compounds represented by aforesaid general formula (6) are listed below, however this invention is not limited thereto.

BR1
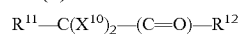

BR2
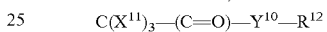

BR3
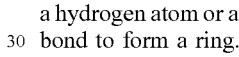

BR4
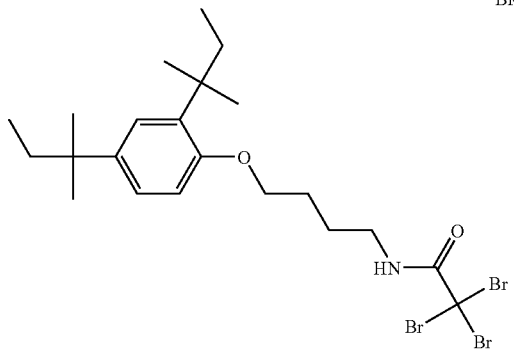

BR5
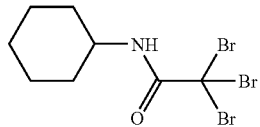

BR6
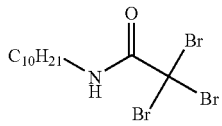

-continued
BR7
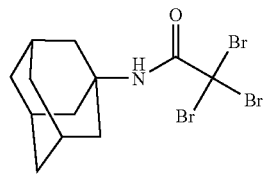
BR8
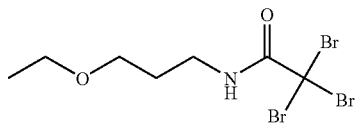
BR9
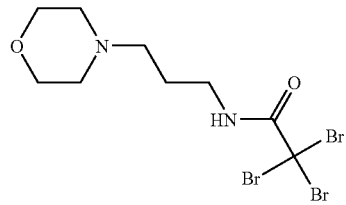
BR10
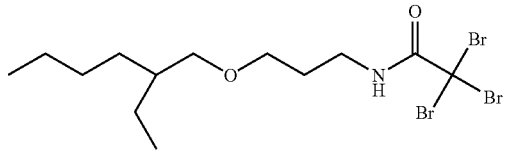
BR11
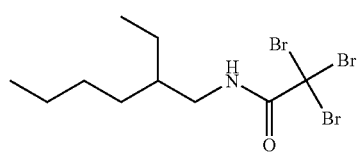
BR12
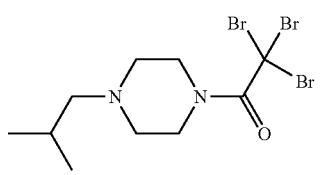
BR13
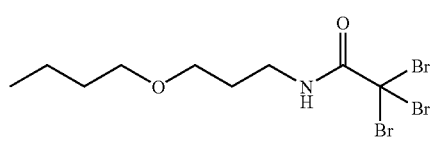
BR14
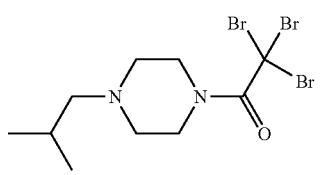
BR15
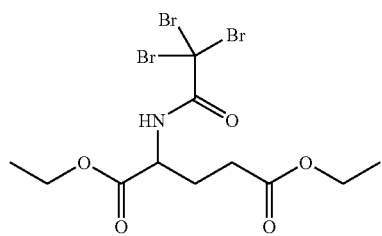
BR16
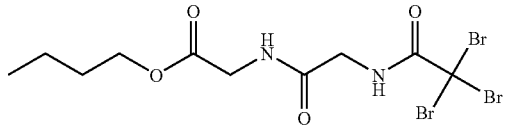
BR17
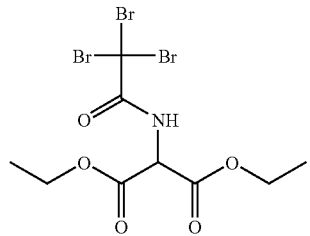
BR18
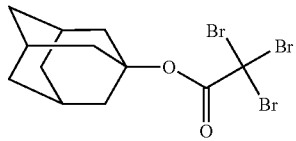
BR19
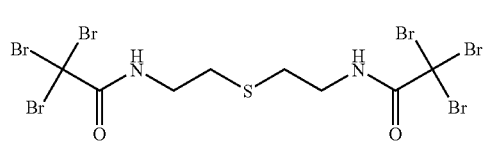
BR20
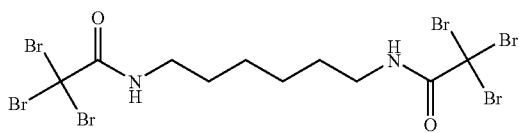
BR21
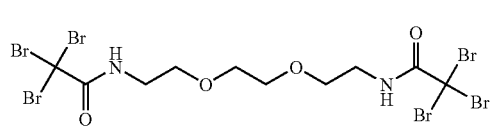
BR22
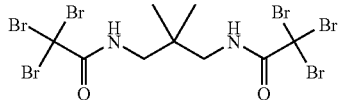

-continued
BR23 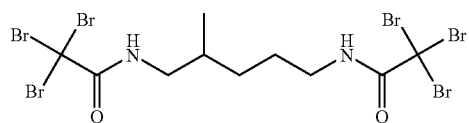
BR24 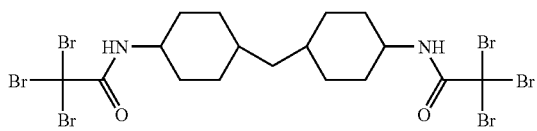
BR25 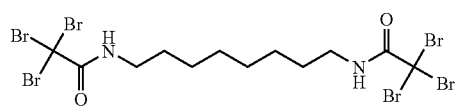
BR26 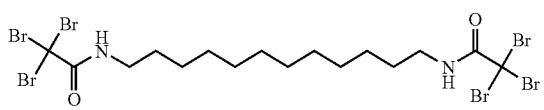
BR27 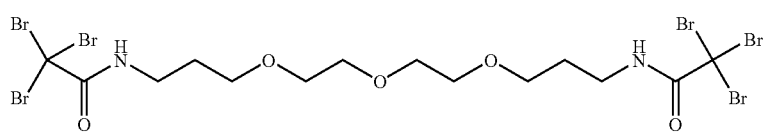
BR28 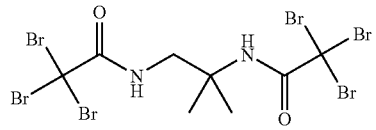
BR29 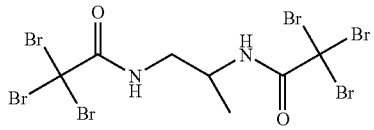
BR30 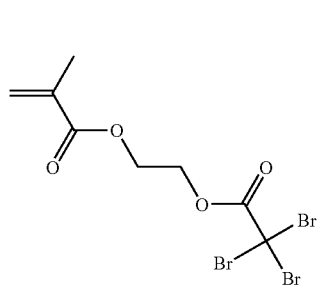
BR31 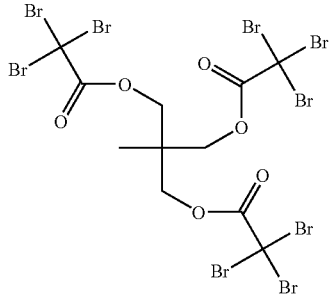
BR32 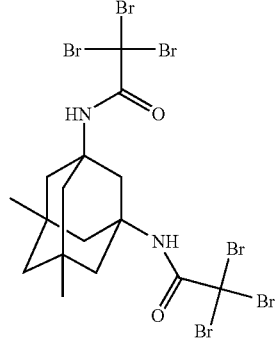
BR33 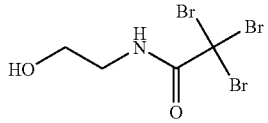
BR34 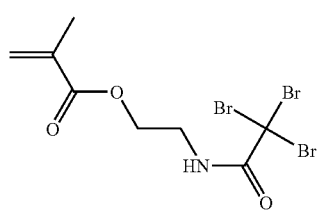

-continued
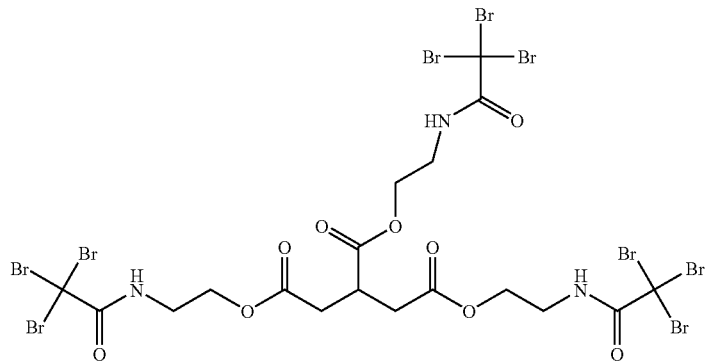
BR35
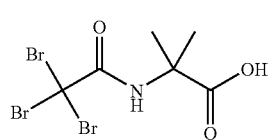
BR36
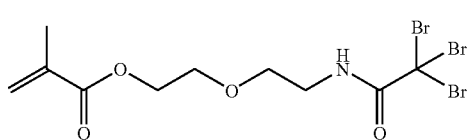
BR37
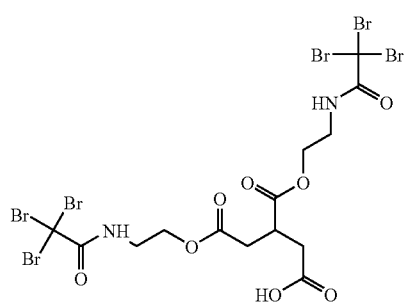
BR38
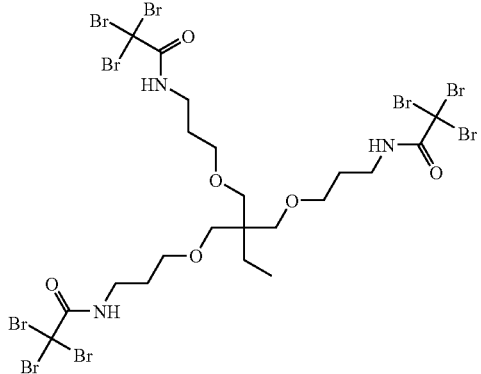
BR39
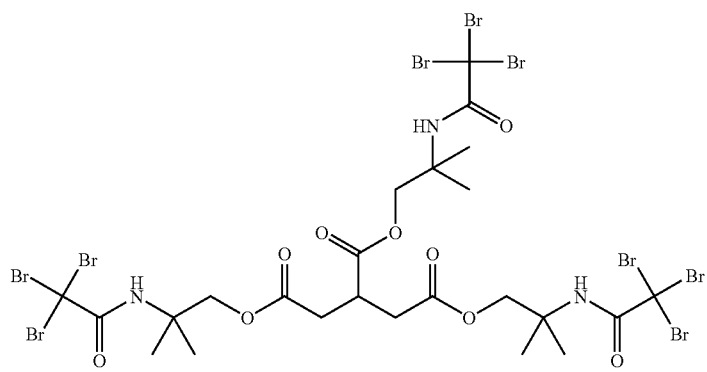
BR40
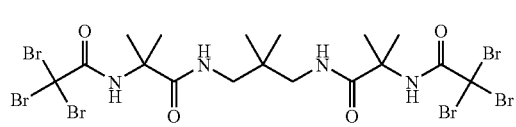
BR41
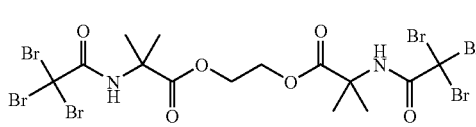
BR42

-continued
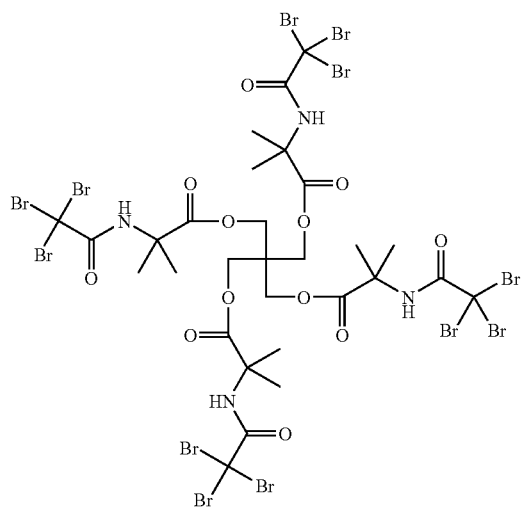
BR43
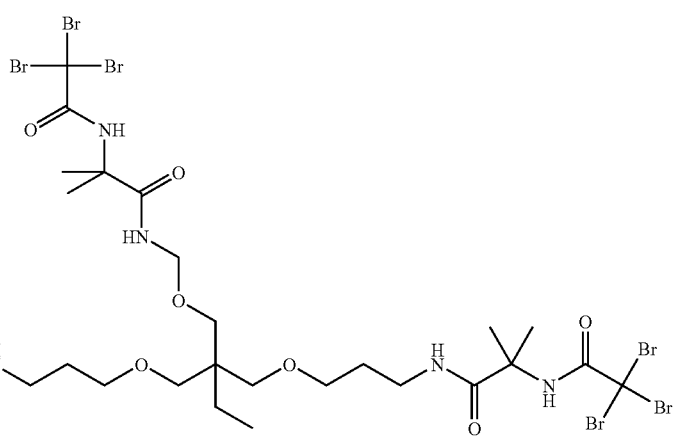
BR44
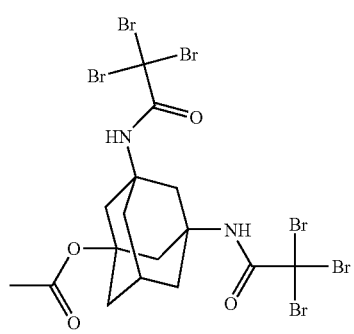
BR45
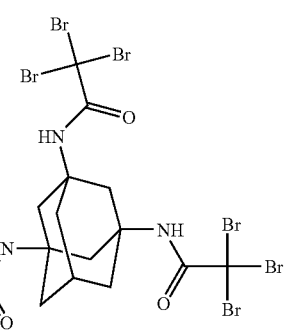
BR46
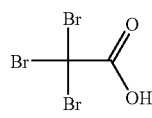
BR47
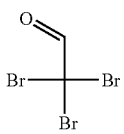
BR48
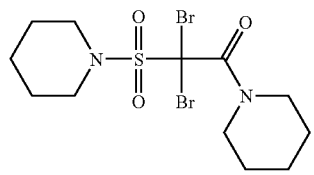
BR49 BR50

-continued
| | |
|---|---|
| BR51 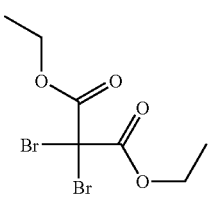 | BR52 |
| BR53 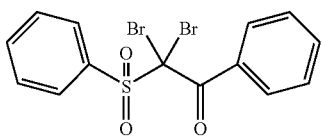 | BR54 |
| BR55 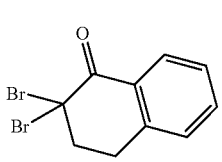 | BR56 |
| BR57 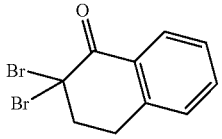 | BR58 |
| BR59 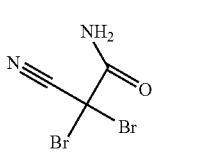 | BR60 |
| 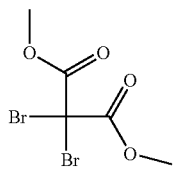 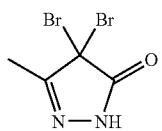 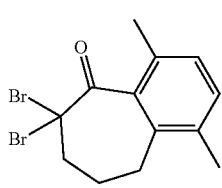 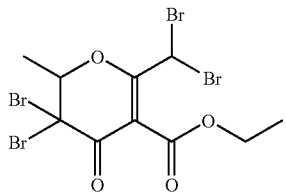 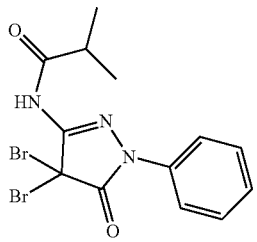 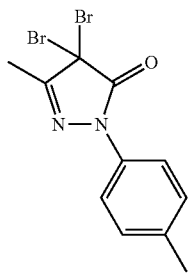 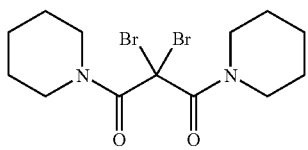 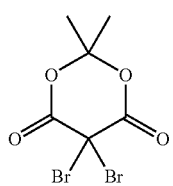 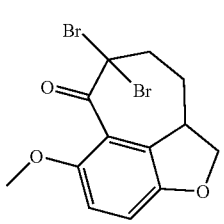 | |
| BR61 | BR62 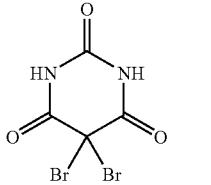 |
| BR63 | BR64 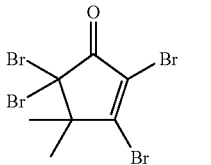 |
| BR65 | BR66 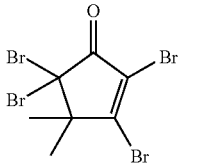 |

-continued

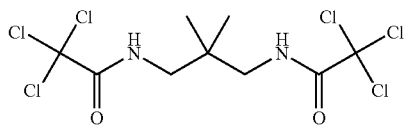
BR67

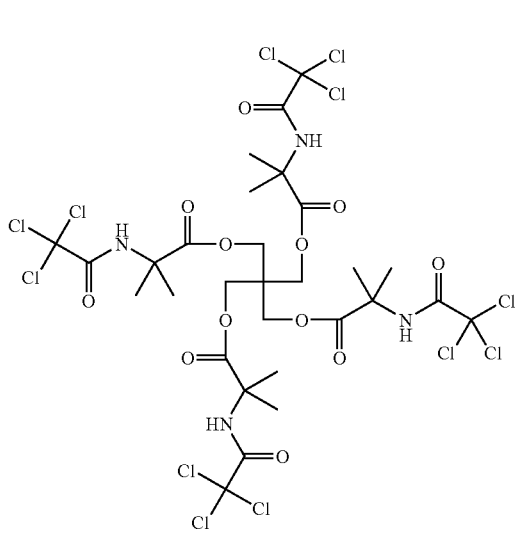
BR68

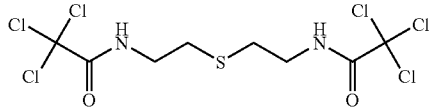
BR69

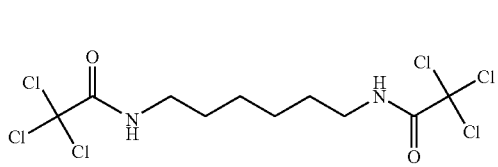
BR70

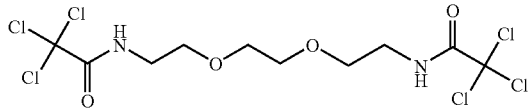
BR71

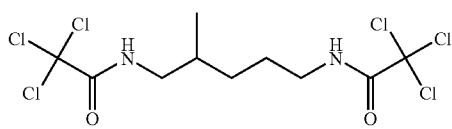
BR72

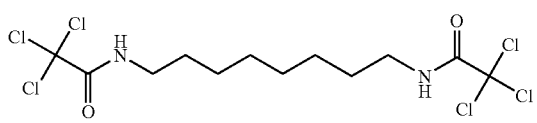
BR73

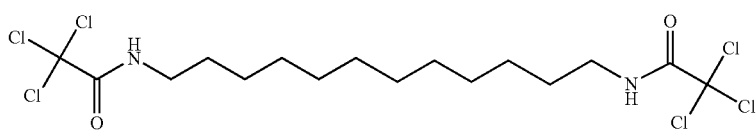
BR74

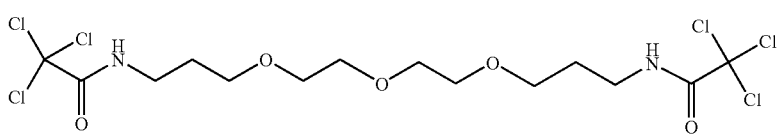
BR75

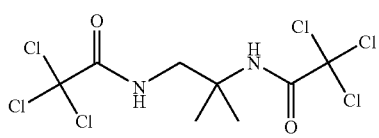
BR76

Further, as a polyacetyl compound, preferably utilized are compounds represented by aforesaid general formula (7). Specific examples of compounds represented by aforesaid general formula (7) are those of BR2–BR47 and BR67–BR76 described above.

In these polyhalogen compounds represented by aforesaid general formula (3)–(7), polybromine compounds are more preferable.

Polyhalogen compounds preferably utilized in this invention further include a trihalomethyl triazine compound.

Listed are, for example, compounds described in Bull. Chem. Soc. Japan, 42, 2924 (1969), by Wakabayashi et. al., such as 2-phenyl-4,6-bis(trichloromethyl)-s-triazine, 2-(p-chlorophenyl)-4,6-bis(trichloromethyl)-s-triazine, 2-(p-tlyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine and 2-($\alpha,\alpha,\beta$-trichloroethyl)-4,6-bis(trichloromethyl)-s-triazine. In addition to this, listed are compounds described in BP No. 1388492, for example, such as 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine and 2-(p-methoxystyryl)-4-amino-6-trichloromethyl-s-triazine; compounds described in JP-A No. 53-133428, for example, such as 2-(4-methoxy-naphtho-1-yl)-4,6-bis(trichloromethyl)-s-triazine, 2-(4-ethoxy-naphtho-1-yl)-4,6-bis(trichloromethyl)-s-triazine, 2-[4-(2-ethoxyethyl)-naphtho-1-yl]-4,6-bis(trichloromethyl)-s-triazine, 2-[4,7-dimethoxy-naphtho-1-yl]-4,6-bis(trichloromethyl)-s-triazine and 2-(acetonaphtho-5-yl)-4,6-bis(trichloromethyl)-s-triazine; and compounds described in German Patent No. 3337024. Further, listed are compounds described in J. Org. Chem., 29, 1527 (1964) by F. C. Schaefer et. al., for example, such as 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine and 2-methoxy-4-methyl-6-trichloromethyl-s-triazine.

(Spectral Sensitizing Dye)

In the case of employing a laser light as a light source, it is preferable that a spectral sensitizing dye is added in a photosensitive layer. Dyes preferably provided with an absorption maximum in the neighborhood of wavelengths of a light source.

Compounds to sensitize against a visible to near infrared light include, for example, cyanine, phthalocyanine, merocyanine, porphyrin, a spiro compound, ferrocen, fluorene, fulgide, imidazole, perylene, phenazine, phenothiazine, polyene, an azo compound, diphenylmethane, triphenylmethane, polymethineacrydine, cumarine, a cumarine derivative, ketocumarine, quinacridone, indigo, styryl, a pyrylium compound, a pyrometene compound, a pyrazolotriazole compound, a benzothiazole compound, a barbituric acid derivative, a thiobarbituric acid derivative, and a ketoalcohol borate complex; and further utilized can be compounds described in European Patent No. 568,993, U.S. Pat. Nos. 4,508,811 and 5,227,227, JP-A Nos. 2001-125255 and 11-271969.

Next, dyes having a maximum absorption at 350–600 nm, which can provide more preferable effects by combination use with the aforesaid iron arene complex compound and a polyhalogen compound according to this invention, include xanthene series, acridine series, cumarin series and barbitur series, and more preferably dyes represented by the following general formula (8).

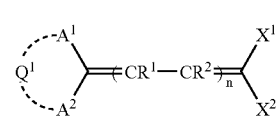

General Formula (8)

In general formula (8), $A^1$ and $A^2$ each represent a carbon atom or a hetero atom. $Q^1$ is a non-metallic atomic group being necessary to form a heterocyclic ring together with $A^1$ and $A^2$ and carbon atoms adjacent thereto. $R^1$ and $R^2$ each represent a hydrogen atom, an alkyl group or an aryl group. $R^1$ and $R^2$ may form a ring by bonding together. $X^1$ and $X^2$ each represent a cyano group or a carbonyl group. $X^1$ and $X^2$ may form a ring by bonding each other. n is preferably 0, 1 or 2.

The specific examples of spectral sensitizing dyes represented by general formula (8) will be shown below, however, this invention is not limited thereto. In the following, some of them are also represented by a combination of a ring completed by $Q^1$ (represented by $Q^1$), a divalent carbon group in which $X^1$ and $X^2$ bond, and n, wherein $R^1=R^2=H$.

| Spectral sensitizing dye No. | $Q^1$ | $\begin{array}{c}X^1\\=\\X^2\end{array}$ ($R^1=R^2=H$) | n |
|---|---|---|---|
| 8-1 |  | 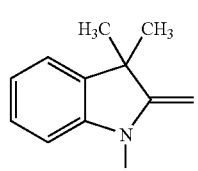 | 1 |
| 8-2 | 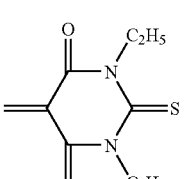 | 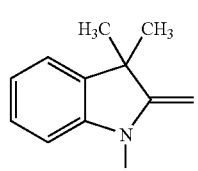 | 1 |

-continued

| Spectral sensitizing dye No. | Q¹ | $\begin{array}{c} X^1 \\ \diagup \\ = \\ \diagdown \\ X^2 \end{array}$ | (R¹=R²=H) n |
|---|---|---|---|
| 8-3 | 3-ethyl-benzoxazol-2-ylidene | 1,3-diethyl-barbituric acid ylidene | 1 |
| 8-4 | 3-ethyl-benzoxazol-2-ylidene | 1,3-diethyl-2-thiobarbituric acid ylidene | 1 |
| 8-5 | 5-methoxy-3-ethyl-benzothiazol-2-ylidene | 1,3-diethyl-2-thiobarbituric acid ylidene | 1 |
| 8-6 | 3-ethyl-benzoxazol-2-ylidene | 2-(dibenzoylmethylene) | 1 |
| 8-7 | 3-(n-C₇H₁₅)-benzothiazol-2-ylidene | dicyanomethylene (CN, CN) | 2 |
| 8-8 | 3-ethyl-benzoxazol-2-ylidene | 1,3-bis(CH₂CO₂CH₃)-barbituric acid ylidene | 1 |
| 8-9 | 1-ethyl-3,3-dimethyl-indolin-2-ylidene | 1,3-di(C₃H₇)-2-thiobarbituric acid ylidene | 1 |

-continued

| Spectral sensitizing dye No. | Q¹ | 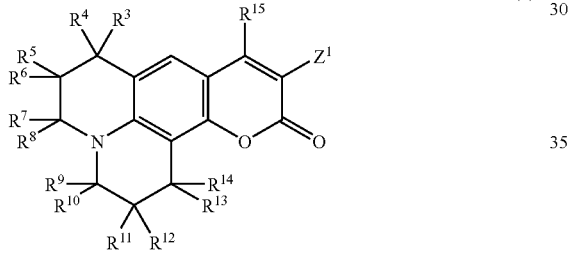 | (R¹=R²=H) n |
|---|---|---|---|
| 8-10 | 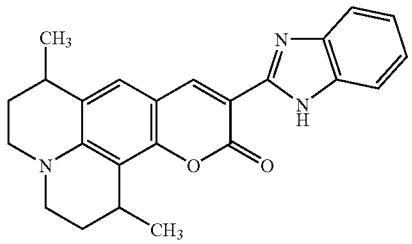 | | 1 |

Other dyes represented by general formula (8) can include compounds described in JP-A No. 9-328505.

Dyes having a maximum absorption at 350–600 nm, which can provide more preferable effects by being utilized further in combination with any of combinations of the aforesaid iron arene complex compound and a polyhalogen compound according to this invention, include dyes represented by the following general formula (9) or (10).

General Formula (9)

In general formula (9), $R^3$, $R^4$, $R^5$, $R^6$, $R^7$, $R^8$, $R^9$, $R^{10}$, $R^{11}$, $R^{12}$, $R^{13}$, $R^{14}$ and $R^{15}$ represent a hydrogen atom, an alkyl group, an alkoxy group, an aryl group, a cyano group, a carboxyl group or an alkyloxycarbonyl group, and $Z^1$ is an aryl group, a heterocyclic group or —$COR^{16}$ ($R^{16}$ is an alkyl group, an alkoxy group, an aryl group, an aryloxy group or a heterocyclic group).

Specific examples of spectral sensitizing dyes represented by general formula (9) are shown below, however, this invention is not limited thereto.

9-1

9-2

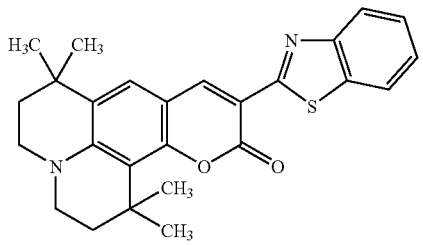

9-3

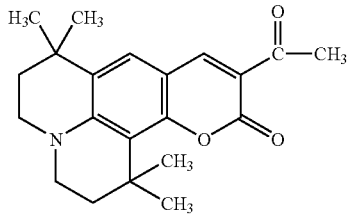

9-4

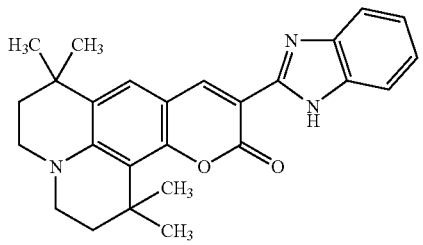

General Formula (10)

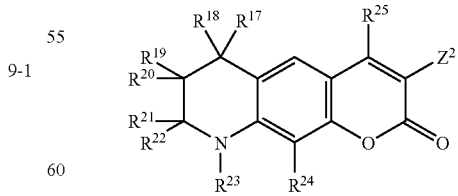

In general formula (10), $R^{17}$, $R^{18}$, $R^{19}$, $R^{20}$, $R^{21}$, $R^{22}$, $R^{23}$, R24 and $R^{25}$ represent a hydrogen atom, an alkyl group, an alkoxy group, an aryl group, a cyano group, a carboxyl group or an alkyloxycarbonyl group, and $Z^2$ is an aryl group, a heterocyclic group or —COR$^{26}$ (R$^{26}$ is an alkyl group, an alkoxy group, an aryl group, an aryloxy group or a heterocyclic group).

Specific examples of spectral sensitizing dyes represented by general formula (10) are shown below, however, this invention is not limited thereto.

10-1
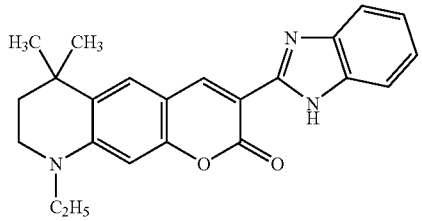

10-2
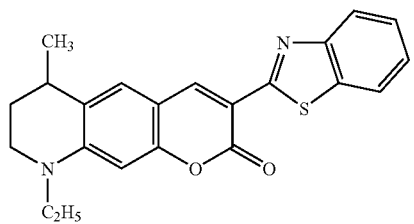

10-3
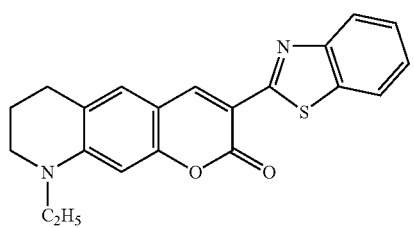

10-4
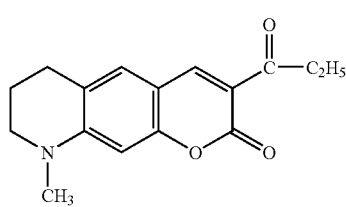

12-1
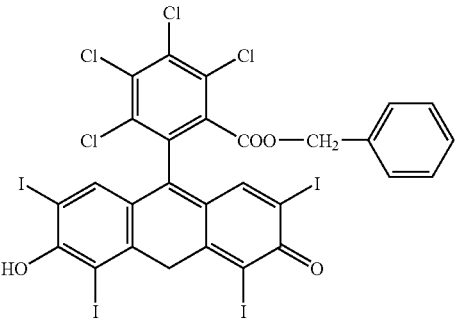

12-2
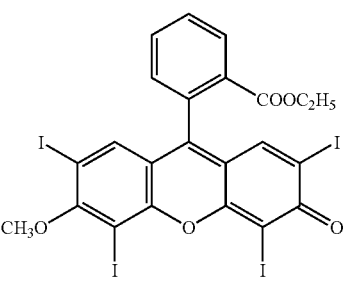

12-3
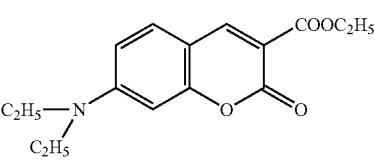

12-4
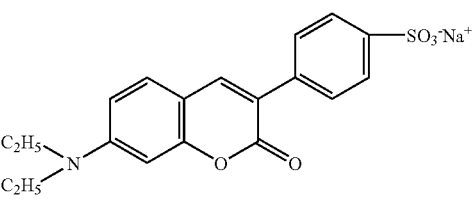

12-5
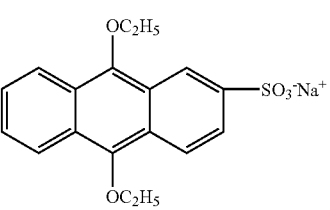

Dyes having a maximum absorption at 350–600 nm, which can provide more preferable effects by being utilized further in combination with in addition to a combination of any of polyhalogen compounds according to this invention and the aforesaid iron arene complex compounds, include xanthene type dyes such as rosevengal, floxine, erythrosine, eosine and fluoresceine, cumarin type dyes and anthraquinone dyes. Specific examples of dyes are shown below, however, this invention is not limited thereto.

Dyes having a maximum absorption at 350–600 nm, which can provide more preferable effects by being utilized further in combination with in addition to a combination of any of polyhalogen compounds according to this invention and the aforesaid iron arene complex compound, include cyanine dyes, carbocyanine dyes, hemicyanine dyes, rhodamine dyes and azamethyne dyes. Specific examples of dyes are shown below, however, this invention is not limited thereto.

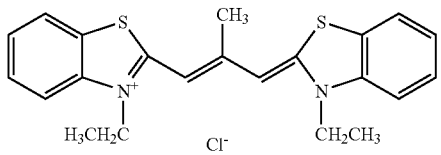

1.

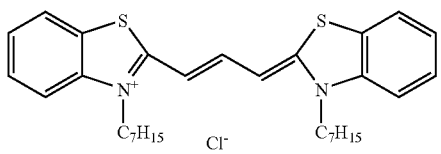

2.

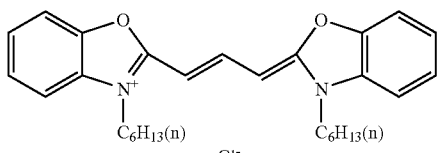

3.

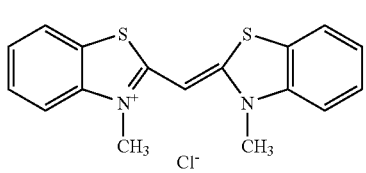

4.

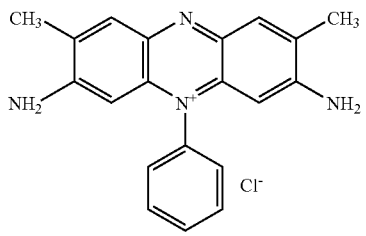

5.

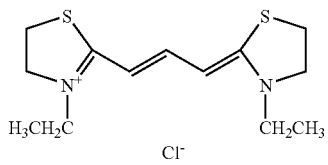

6.

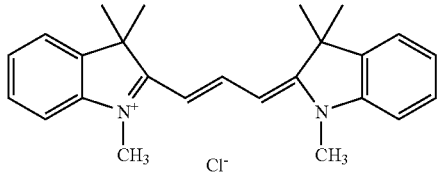

7.

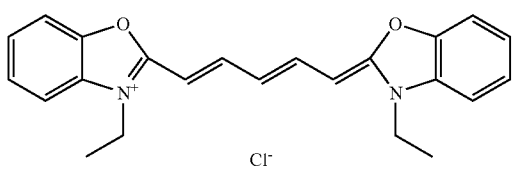

8.

Next, dyes having a maximum absorption at 350–600 nm, which can provide more preferable effects by being utilized further in combination with in addition to any of the polyhalogen compounds according to this invention or to any of the polyhalogen compounds and the aforesaid iron complex compounds according to this invention, include dyes described in JP-A Nos. 2000-98605, 2000-147763, 2000-206690, 2000-258910, 2001-42524 and 2001-100412. Furthermore preferable are compounds represented by following general formula (11).

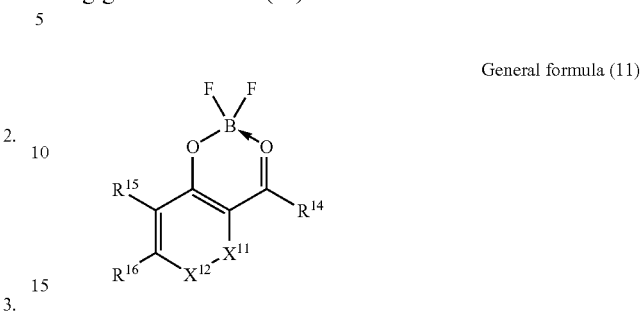

General formula (11)

In the formula, $R^{14}$ is a hydrogen atom; or an alkyl group, an alkenyl group, an aryl group or a heterocyclic group, which may be provided with a substituent. $R^{15}$ and $R^{16}$ represent a substituting group to form a ring by being bonded. $X^{11}$ and $X^{12}$ each independently represent —C($R^{17}R^{18}$)—, —O—, —S— or —N($R^{19}$)—. $R^{17}$, $R^{18}$ and $R^{19}$ each independently represent a hydrogen atom; or an alkyl group, an alkenyl group, an aryl group or a heterocyclic group, which may be provided with a substituent.

Alkyl groups which may be provided with a substituent and are represented by $R^{14}$ include, for example, such as a methyl group, an ethyl group, a propyl group, a butyl group, a hexyl group, an octyl group, a decyl group, a dodecyl group, an isopropyl group, an isobutyl group, an isopentyl group, a tert-butyl group and a 2-ethylhexyl group; alkenyl groups which may be provided with a substituent and are represented by $R^{14}$ include, for example, such as a vinyl group, a 2-propenyl group, a 3-butenyl group, a 1-methyl-3-propenyl geroup, a 3-pentenyl group, a 1-methyl-3-butenyl group and 4-hexenyl group; aryl groups which may be provided with a substituent and are represented by $R^{14}$ include, for example, such as a benzyl group and a phenethyl group; heterocyclic groups which may be provided with a substituent and are represented by $R^{14}$ include, for example, hetrocyclic groups derived from 5- or 6-member heterocyclic rings, such as a pyrrole ring, an imidazole ring, a pyrazole ring, an oxazole ring, a thiazole ring, an oxadiazole ring, a thiadiazole ring, a benzimidasole ring, a pyridine ring, a furan ring, a thiophene ring, a chroman ring, a cumarin ring, a pyrrolidine ring, a piperidine ring, a morpholine ring, a sulforane ring, a tetrahydrofurane ring and a tetrahydropyran ring.

Further, alkyl groups, alkenyl groups, aryl groups and hetrocyclic groups, which may be provided with a substitutent, and are represented by $R^{17}$, $R^{18}$ and $R^{19}$ include the same each group described in the description of $R^{14}$ above.

Typical examples of spectral sensitizing dyes represented by general formula (11) are shown below, however, this invention is not limited thereto.

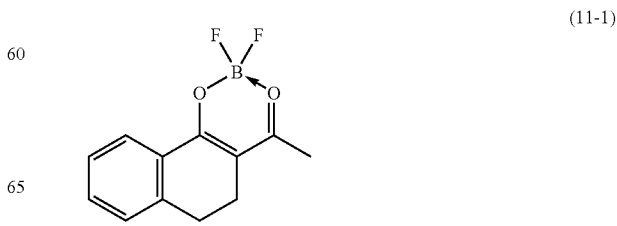

(11-1)

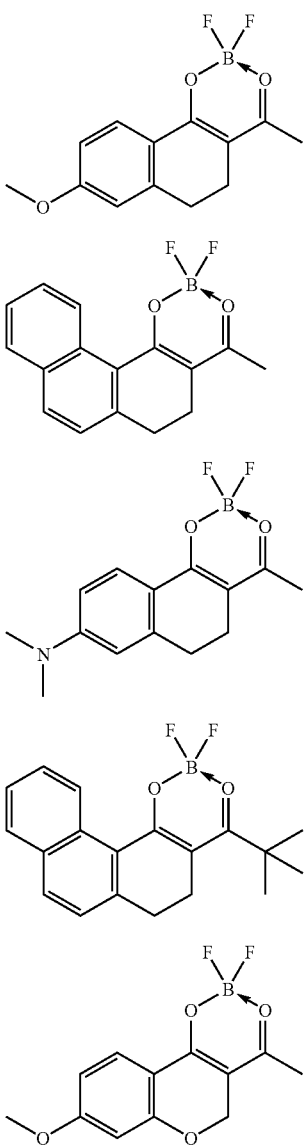

Spectral sensitizing dyes represented by general formula (11) can be prepared by synthesizing according to methods well known in the art.

The absorption maximum of a spectral sensitizing dye is determined by measuring the visible-light spectrum by being dissolved in acetonitrile at ordinary temperature. Dyes insoluble in acetontrile may be dissolved in such as alcohol series, 2-butanone and water.

In this invention, a spectral sensitizing dye can be added by being dissolved in an appropriately selected solvent such as water and organic solvents; organic solvents, for example, include alcohol series such as methanol, ethanol, propanol and butanol; ketone series such as acetone, methylethyl ketone and cyclohexanone; aromatic hydrocarbon series such as benzene, toluene and xylene; glycol series such as ethylene glycol, propylene glycol and hexylene glycol; glycol ether series such as ethyl celosolve, butyl celosolve, ethyl carbitol, butyl carbitol, diethyl celosolve and diethyl carbitol; N-methyl pyrrolidone and dimethyl formamide, and they are utilized alone or in combination of two or more types.

In this invention, an addition amount of a spectral sensitizing dye is not indiscriminately specified, however, is preferably 0.1–10 weight parts and more preferably 0.5–5 weight parts, per 100 weight parts of a photosensitive composition excluding the solvent. A mixing ratio of a photopolymerization initiator and a spectral sensitizing dye is preferably in a range of 1/100–100/1 based on a mole ratio.

(Polymer Binder)

Next, a polymer binder will be explained.

As a polymer binder employed in such as a photopolymerizing photosensitive layer of this invention, utilized can be, for example, such as acrylic type polymers, polyvinyl butyral resin, polyurethane resin, polyamide resin, polyester resin, epoxy resin, phenol resin, polycarbonate resin, polyvinyl butyral resin, polyvinyl formal resin, shellac and other natural resins. Further, they may be utilized in combination of two or more types.

In the aforesaid each polymer binder, preferable is a vinyl type polymer prepared by co-polymerization of an acrylic type monomer, and further preferable as a copolymerizing composition of the polymer binder is (a) a carboxyl group containing monomer, (b) methacrylic acid alkylester or methacrylic acid alkylester.

Specific examples of a carboxyl group containing monomer include α,β-unsaturated carboxylic acid series, for example, such as acrylic acid, methacrylic acid, maleic acid, maleic acid unhydride, itaconic acid and itaconic acid unhydride. In addition to this, also preferable is carboxylic acid such as a half ester of phthalic acid and 2-hydroxymethacrylate.

Specific examples of methacrylic acid alkylester and acrylic acid alkylester include, for example, in addition to unsubstituted alkylesters such as methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, dodecyl methacrylate, methyl acrylate, ethyl acrylate, propyl acrylate, butyl acrylate, amyl acrylate, hexyl acrylate, heptyl acrylate, octyl acrylate, nonyl acrylate, decyl acrylate, undecyl acrylate and dodecyl acrylate; cyclic alkylesters such as cyclohexyl methacrylate and cyclohexyl acrylate; and substituted alkylesters such as benzyl methacrylate, 2-chloroethyl methacrylate, N,N-dimethylaminoethyl methacrylate, glycidyl methacrylate, benzyl acrylate, 2-chloroethyl acrylate, N,N-dimethylamono ethylacrylate.

Further, in a polymer binder according to this invention, monomers described in following (1)–(14) can be utilized as other co-polymerizing monomers.

(1) Monomers provided with an aromatic hydroxyl group, for example, such as o-(or p-, m-)hydroxystyrene and o-(or p-, m-)hydroxyphenyl acrylate.

(2) Monomers provided with an aliphatic hydroxyl group, for example, such as 2-hydroxyethyl acrylate, 2-hydroxyethyl methacrylate, N-methylol acrylamide, N-methylol methacrylamide, 4-hydroxybutyl methacrylate, 5-hydroxypentyl acrylate, 5-hydroxymethyl methacrylate, 6-hydroxyhexyl acrylate, 6-hydroxyhexyl methacrylate, N-(2-hydroxyethyl) acrylamide, N-(2-hydroxyethyl) methacrylamide and hydroxyethyl vinylether.

(3) Monomers provided with an aminosulfonyl group, for example, such as m-(or p-)aminosulfonylphenyl methacrylate, m-(or p-)aminosulfonylphenyl acrylate, N-(p-aminosulfonylphenyl) methacrylamide and N-(p-aminosulfonylphenyl) acrylamide.

(4) Monomers provided with an sulfonamide group, for example, such as N-(p-toluenesulfonyl) acrylamide and N-(p-toluenesulfonyl) methacrylamide.

(5) Acrylamide or methacrylamide series, for example, such as acrylamide, methacrylamide, N-ethylacrylamide, N-hexylacrylamide, N-cyclohexylacrylamide, N-phenylacrylamide, N-(4-nitrophenyl)acrylamide, N-ethyl-N-phenylacrylamide, N-(4-hydroxyphenyl)acrylamide and N-(4-hydroxyphenyl)methacrylamide.

(6) Monomers provided with a fluoroalkyl group, for example, such as trifluoroethyl acrylate, trifluoroethyl methacrylate, tetrafluoropropyl methacrylate, hexafluoropropyl methacrylate, octafluoropentyl acrylate, octafluoropentyl methacrylate, heptadecafluorodecyl methacrylate and N-butyl-N-(2-acryloxyethyl)heptadecafluorooctyl sulfonamide.

(7) Vinylether series, for example, such as ethylvinylether, 2-chloroethylvinylether, propylvinylether, butylvinylether, octylvinylether and phenylvinylether.

(8) Vinylester series, for example, such as vinylacetate, vinylchloroacetate, vinylbutylate and vinyl benzoic acid.

(9) Styrene series, for example, such as styrene, methyl styrene and chloromethyl styrene.

(10) Vinyl ketone series, for example, such as methyl vinyl ketone, ethyl vinyl ketone, propyl vinyl ketone and phenyl vinyl ketone.

(11) Olefin series, for example, such as ethylene, propylene, i-butylene, butadiene and isoprene.

(12) Such as N-vinylpyrrolidone, N-vinylcarbazole and 4-vinylpyridine.

(13) Monomers provided with a cyano group, for example, such as acrylonitrile, methacrylonitrile, 2-pentenenitrile, 2-methyl-3-butenenitrile, 2-cyanoethyl acrylate and o-(or m-, p-)cyano styrene.

(14) Monomers provided with an amino group, for example, such as N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethyl acrylamide, acryloyl morpholine, N-i-propyl acrylamide and N,N-diethyl acrylamide.

Further, a monomer being copolymerizable with these monomers may be copolymerized.

Further, also preferable as a polymer binder is a double bond containing vinyl type copolymer, which can be prepared by addition polymerization of a compound having a (meth)acryloyl group and an epoxy group in the molecule with a carboxyl group being present in the molecule of the aforesaid vinyl type copolymer. A compound having a double bond and an epoxy group together in the molecule includes specifically such as glycidyl acrylate, glycidyl methacrylate, epoxy group-containing double bond compounds described in JP-A No. 11-271969.

These copolymers preferably have a weight average molecular weight, measured by means of gel permeation chromatography (GPC), of 10,000–200,000, however, it is not necessarily limited to this region.

In the above polymer binders, other arbitrary polymer binders such as polyvinyl butyral resin, polyurethane resin, polyamide resin, polyester resin, epoxy resin, novolak resin and natural resin may be appropriately utilized in combination with the above each vinyl type copolymer.

The content of the aforesaid polymer binder in a composition to coat a photo-polymerizing photosensitive layer is preferably in a range of 10–90 weight %, more preferably 15–70 weight % and specifically preferably 20–60 weight %, with respect to sensitivity.

Further, a vinyl type copolymer prepared by copolymerization of an acryl type monomer is preferably contained at 50–100 weight % and more preferably 80–100 weight %, in the polymer binder.

An acid value of a polymer contained in the polymer binder according to this invention is preferably in a range of 10–150, more preferably 30–120 and specifically preferably 50–90, with respect to keeping the balance of polarity of the whole photosensitive layer, which results in prevention of coagulation of a pigment in a photosensitive layer coating solution.

In the following, successively explained will be such as various types of additives can be incorporated in a photosensitive composition, a support as a photosensitive planographic printing plate, a protective layer, coating of a photosensitive composition, and an image forming method of a photosensitive planographic printing plate, in this invention.

(Various Types of Additives)

In a photo-polymerizing photosensitive layer containing a photosensitive composition of this invention, preferably added is a polymerization inhibitor in addition to the aforesaid components to prevent unnecessary polymerization of an ethylenic double bond containing monomer which is polymerizable during manufacturing or storage of a photosensitive planographic printing plate. Appropriate polymerization inhibitors include such as hydroquinone, p-methoxyphenol, di-t-butyl-p-cresole, pyrrogarole, t-butyl catecol, benzoquinone, 4,4'-thiobis(3-methyl-6-t-butylphenol), 2,2'-methylenebis(4-methyl-6-t-butylphenol), N-nitrosophenyl hydroxylamine cerium(III) salt and 2-t-butyl-6-(3-t-butyl-2-hydroxy-5-methylbenzyl)-4-methylphenyl acrylate.

The addition amount of a polymerization inhibitor is preferably approximately 0.01–5.0% based on the total solid weight of the aforesaid composition. Further, to prevent polymerization hindrance, added appropriately may be higher fatty acid derivatives such as behenic acid and behenic acid amide, which is localized on the surface of a photosensitive layer during the drying process after coating. The addition amount of a higher fatty acid derivative is preferably approximately 0.5–10.0% based on the total composition.

Further, a colorant can be also employed, and can be preferably utilized are commonly known colorants including those available on the market. For example, listed are those described in such as Pigment Hand Book, edited by Japan Pigment Technology Association (published by Seibundo Shinkosya) and Color Index Hand Book.

Types of pigments include a black pigment, a yellow pigment, a red pigment, a blown pigment, a purple pigment, a blue pigment, a green pigment, a fluorescent pigment and metallic powder pigment. Specifically, listed are inorganic pigments (such as titanium dioxide, carbon black, graphite, zinc oxide, Purussian Blue, cadmium sulfide, iron oxide and chromates of lead, zinc, barium and calcium), organic pigments (pigments of an azo type, a thioindigo type, an anthraquinone type, an anthoanthrone type, a triphenedioxane type, a bat dye pigment, a phthalocyanine pigment and derivatives thereof, and quinacridone).

Among them, preferably utilized by appropriate selection is a pigment which essentially has no absorption in a wavelength region of a spectral sensitizing dye corresponding to an exposing laser employed; in this case, a reflective absorption of a pigment by means of an integrating cube with a laser wavelength utilized is preferably not more than 0.05. Further, an addition amount of a pigment is preferably 0.1–10.0 weight % and more preferably 0.2–5.0 weight %, based on the solid content of the aforesaid composition.

In the case of employing an argon laser (488 nm) or a SHG-YAG laser (532 nm) as an exposure light source, preferably utilized are a purple pigment or a blue pigment with respect to pigment absorption in the aforesaid photosensitive wavelength region and image visibility after development. Such pigments include, for example, Cobalt Blue, cerulean blue, Alkali Blue, Phonatone Blue 6G, Victoria Blue Lake, metal-free Phthalocyanine Blue, Phthalocyanine Fast Sky Blue, Indathrene Blue, indigo, Dioxane Violet, Isoviolanthrone Violet, Indanthrone Blue and Indanthrone BC. Among them, more preferable are Phthalocyanine Blue and Dioxane Violet.

Further, the aforesaid composition can contain a surfactant as a coating aid in a range of not damaging characteristics of this invention. Among them preferable is a fluoride type surfactant.

Further, to improve physical properties of a cured film, added can be additives of such as an inorganic filling agent and a plastisizer such as dioctyl phthalate, dimethyl phthalate and tricresyl phosphate. An addition amount of these additives is preferably not more than 10% based on the total solid amount.

Further, solvents utilized to prepare a photosensitive composition of a photo-polymerizing photosensitive layer according to this invention preferably include, for example, alcohol and polyhydric alcohol derivatives such as sec-butanol, iso-butanol, n-hexanol, benzyl alcohol, diethylene glycol, triethylene glycol, tetraethylene glycol, 1,5-pentane diol; ether series such as propyleneglycol monobutylether, dipropyleneglycol monometylether and tripropyleneglycol monometylether; ketone series such as diacetone alcohol, cyclohexanone and methylcyclohexanone; aldehyde series; and ester series such as ethyl lactate, butyl lactate, diethyl oxalate and methyl benzoate.

(Protective Layer: Oxygen Shielding Layer)

A protective layer is preferably provided on the upper side of a photo-polymerizing photosensitive layer according to this invention. The protective layer (an oxygen shielding layer) is preferably has a high solubility against a developer solution (being generally an alkaline aqueous solution) described below, and is specifically comprised of such as polyvinyl alcohol and polyvinyl pyrrolidone. Polyvinyl alcohol has an effect to depress oxygen permeation, and polyvinyl pyrrolidone has an effect to secure adhesion with an adjacent photosensitive layer.

In addition to the aforesaid two types of polymers, appropriately utilized in combination can be water-soluble polymers such as polysacchride, polyethylene glycol, gelatin, glue, casein, hydroxyethyl cellulose, carboxymethyl cellulose, methyl cellulose, hydroxyethyl starch, gum arabi, saccharose octaacetate, ammonium alginate, sodium alginate, polyvinyl amine, polyethylene oxide, polystyrene sulfonate, polyacrylic acid and water-soluble polyamide.

In a photosensitive planographic printing plate of this invention, a peeling strength between a photosensitive layer and a protective layer is preferably not less than 35 mN/mm, more preferably not less than 50 mN/mm and furthermore preferably not less than 75 mN/mm. A preferable composition of a protective layer includes those described in Japanese Patent Application No. 8-161645.

A peeling strength in this invention can be determined by pasting up an adhesive tape of a predetermined width having a sufficiently large stickiness on a protective layer and measuring a strength to peel off the tape together with the protective layer at an angle of 90 degree against the plane of a photosensitive planographic printing plate material.

In a protective layer, appropriately contained can be such as a surfactant and a matting agent. The aforesaid protective layer composition is dissolved in an appropriate solvent and coated on a photosensitive layer followed by being dried to prepare a protective layer. A primary component of the coating solvent is specifically preferably water or alcohol series such as methanol, ethanol and iso-propanol.

A thickness of the protective layer is preferably 0.1–5.0 μm and specifically preferably 0.5–3.0 μm.

(Support)

As a support according to this invention, an aluminum support having a hydrophilic surface is employed, and an aluminum support used in this invention is may either pure aluminum or aluminum alloy.

As aluminum alloy for a support, utilized can be various types, for example, aluminum alloy of a metal such as silicon, copper, manganese, magnesium, chromium, zinc, bismuth, nickel, titanium, sodium or iron, with aluminum.

A support is preferably subjected to a degrease treatment to remove a rolling oil on the surface prior to roughening (a graining treatment). As a degrease treatment, employed are a degrease treatment using a solvent such as trichlene and thinner and an emulsion degrease treatment using an emulsion of such as checirone and triethanol. Further, an alkaline aqueous solution of such as caustic soda can be also employed for a degrease treatment. In the case of employing an alkaline aqueous solution of such as caustic soda for a degrease treatment, dirt and oxidized film, which cannot be removed only by the aforesaid degrease treatment, can be also removed. In the case of employing an alkaline aqueous solution of such as caustic soda for a degrease treatment, since smut is formed on the surface of a support, it is preferable to perform a desmut treatment by immersing the plate into such as phosphoric acid, nitric an acid, sulfuric acid and chromic acid, or into a mixed acid thereof.

As a roughening method utilized in this invention, roughening is performed by means of electrolysis, however, roughening by means of a mechanical method may be performed prior to the electrolysis.

A mechanical roughening method utilized is not specifically limited, however, preferable are a blush grinding method and a horning grinding method. Roughening by means of a blush grinding method, for example, can be performed by rotating a rotation blush employing a blush fur of a diameter of 0.2–0.8 mm, and pushing the blush onto the surface of a support while supplying a slurry in which volcanic ash particles having a particle diameter of 10–100 μm are homogeneously dispersed in water. Roughening by means of horning grinding, for example, can be performed by homogeneously dispersing volcanic ash particles having a particle diameter of 10–100 μm in water, which is ejected through a nozzle under pressure to be collided onto the surface of a support in a oblique direction, resulting in roughening of the surface. Further, for example, roughening can be also performed by laminating a sheet, in which grinding particles having a particle diameter of 10–100 μm are coated on a support so as to make intervals of 100–200 μm and a density of $2.5 \times 10^3$–$10 \times 10^3$ particles/cm$^2$, and applying a pressure to transfer the rough surface pattern of the sheet on to the support surface.

It is preferable to immerse a support in an acid or alkali aqueous solution after having been roughened by the aforesaid mechanical roughening method to remove such as grinding materials implanted in the surface of a support and aluminum dust formed. Acid employed includes, for example, such as sulfuric acid, persulfuric acid, hydrofluoric acid, phosphoric acid, nitric acid and hydrochloric acid, and base includes, for example, such as sodium hydroxide and potassium hydroxide. Among them, preferably employed is an alkali aqueous solution of such as sodium hydroxide. An amount of dissolution of aluminum of the surface is preferably 0.5–5.0 g/m$^2$ . The support is preferably subjected to a neutralization treatment by being immersed in acid such as phosphoric acid, nitric acid, sulfuric acid and chromic acid or a mixed acid thereof after an immersing treatment by an alkali aqueous solution.

In this invention roughening by means of electrolysis is performed as a method of roughening. It is a method of electrochemically roughening the surface in an acid electrolytic solution, and electrolytic roughening is performed, in a hydrochloric acid type or a nitric acid solution having a concentration of not less than 0.4 weight % and not more than 2.8 weight %, at an effective current density of not lee than 30 A/dm$^2$ and not more than 100 A/dm$^2$ for 10–120 seconds. The concentration of hydrochloric acid or nitric acid is more preferably not less than 1 weight % and not more than 2.3 weight %. The current density is more preferably 30–80 A/dm$^2$ and furthermore preferably 40–75 A/dm$^2$.

The temperature to perform the electrolytic roughening method is not specifically limited, however, it is preferably in a range of 5–80° C. and more preferably selected in a range of 10–60° C. The applying voltage is also not specifically limited, however, it is preferably in a range of 1–50 V and more preferably selected in a range of 10–30 V. The quantity of electricity is also not specifically limited, however, it is preferably in a range of 100–5000 C/dM$^2$ and more preferably selected in a range of 100–2000 C/dM$^2$.

In an electrolytic solution, appropriately added may be such as nitrate salts, chloride compounds, amine series, aldehyde series, phosphoric acid, chromic acid, boric acid, acetic acid and oxalic acid.

The plate is preferably immersed into an acid or alkaline aqueous solution after having been roughened by means of the aforesaid electrolytic roughening method to remove such as aluminum dust on the surface. Utilized as acid are, for example, such as sulfuric acid, persulfuric acid, hydrofluoric acid, phosphoric acid, nitric acid and hydrochloric acid, and utilized as base are, for example, such as sodium hydroxide and potassium hydroxide. Among them preferably utilized is an alkaline aqueous solution. The dissolution amount of aluminum of the surface is preferably 0.5–5.0 g/m$^2$. Further, the plate is preferably subjected to a neutralization treatment by being immersed in acid such as phosphoric acid, nitric acid, sulfuric acid and chromic acid or a mixed acid thereof, after having been subjected to an immersion treatment by an alkaline aqueous solution.

After electrolytic roughening treatment, the plate may be subjected to an anodic oxidation treatment. An anodic oxidation method utilized in this invention is not specifically limited, and commonly known methods can be employed. An oxidized film is formed on a support by an anodic oxidation treatment. As the anodic oxidation treatment, preferably utilized is a method in which electrolysis at-a current density of 1–10 A/dm$^2$ employing an aqueous solution containing sulfuric acid and/or phosphoric acid at a concentration of 10–50% as an electrolytic solution, however, in addition to this, listed are such as a method described in U.S. Pat. No. 1,412,768, in which electrolysis at a high current density is performed in sulfuric acid, a method described in U.S. Pat. No. 3,511,661, in which electrolysis is performed in phosphoric acid, and a method which employs a solution containing one or two types of acids such as chromic acid, oxalic acid and malonic acid. An anodic oxidation coverage amount formed is appropriately 1–50 mg/dm$^2$ and preferably 10–40 mg/dm$^2$. An anodic oxidation coverage amount is determined, for example, by immersing an aluminum plate in a phosphoric chromic acid solution (being prepared by dissolving 35 ml of 85% phosphoric acid solution and 20 g of chromium(IV) oxide in 1 L of water) to dissolve an oxidized film and measuring the weight change of the plate between prior and after dissolution of the coverage.

In this invention, a support is preferably subjected to a treatment by a sodium silicate solution at 20–50° C. after an anodic oxidation treatment. The temperature is preferably 20–50 ° C. and more preferably 20–45° C. In the case of lower than 20° C., recovery from smudge may be deteriorated. While, in the case of higher than 50° C., printing durability may be deteriorated. A concentration of sodium silicate is not specifically limited, however, it is preferably 0.01–35% and more preferably 0.1–5.0%.

In this invention, a support is preferably subjected to a treatment by a vinylsulfonic acid solution at 20–70° C. after an anodic oxidation treatment. The temperature is preferably not higher than 70° C. and more preferably 30–65° C. In the case of lower than 20° C., recovery from smudge may be deteriorated. While, in the case of higher than 70° C., printing durability may be deteriorated. A concentration of vinylsulfonic acid is not specifically limited, however, it is preferably 0.01–35% and more preferably 0.1–5.0%.

(Coating)

A photosensitive composition (photo-polymerizing photosensitive layer coating solution) thus prepared can be coated by means of commonly known method on a support and followed by being dried to prepare a photosensitive planographic printing plate. Coating methods of a coating solution include, for example, such as an air-doctor coater method, a blade coater method, a wired bar method, a knife coater method, a dip coater method, a reverse roll coater method, a gravure coater method, a cast coating method, a curtain coater method and an extrusion coater method.

When drying temperature of a photosensitive layer is too low, it is difficult to obtain sufficient printing durability, and when it is too high, caused are Marangoni effects as well as fogging in a non-image portion. A drying temperature range is preferably 60–160° C., more preferably 80–140° C. and specifically preferably 90–120° C.

(Image Forming Method)

In this invention, as a light source to perform an image exposure on a planographic printing plate, for example, laser exposure is employed. As a laser light source, appropriately utilized can be any of an argon laser, a He—Ne gas laser, a YAG laser and a semiconductor laser and the like. In this invention, preferably utilized is a laser light having an emission wavelength in a visible region. Specifically, preferable are such as a two-times higher wavelength mode YAG laser which emits in the neighborhood of 532 nm and an argon ion laser which emits in the neighborhood of 488 nm. Further, preferably utilized is a semiconductor laser comprising an InGaN or ZnSe type material and can emits continuously in a range of 380–430 nm.

A scanning method of a laser includes such as cylindrical outer surface scanning, cylindrical inner surface scanning and flat bed scanning. In cylindrical outer surface scanning, laser exposure is performed while rotating a drum on the outer surface of which a recording material having been wound, and rotation of a drum performs main scanning and shift of a laser light performs sub scanning. In cylindrical inner surface scanning, laser beam is irradiated from the inside while a recording material being fixed in the inside of a drum, and rotation of the part of or whole of an optical system performs main scan in a circumferential direction while linear transition of the part of or whole of an optical system parallel to an axis of a drum performs sub scan in an axis direction. In flat bed scanning, main scan is performed by means of combination use of a polygon mirror and a galvanomirror with fθ lens and sub scan is performed by transition of a recording medium. Cylindrical outer surface scanning and cylindrical inner surface scanning are suitable for high resolution recording because higher precision of an optical system can easily be achieved.

(Pre-Heating)

In this invention, after images having been exposed on a planographic printing plate, the photosensitive planographic printing plate is preferably subjected to a thermal treatment prior to or during the development process. By being subjected to such a heat treatment, adhesion between a photosensitive layer and a support is enhanced, resulting in improvement of effects of the invention according to this invention.

Pre-heating according to this invention, for example, includes a method in which, in an automatic processor to develop a photosensitive planographic printing plate material, the photosensitive planographic printing plate is heated to a predetermined temperature range before development by use of a pre-heating roller while being transferred at the time of development. For example, a pre-heating roller is constituted of one pair of rollers containing at least one roller inside which provided with a heating means, and as a roller provided with a heating means can be utilized is one in which such as an Nichrome wire exothermic material and the outer surface of the metal pipe is covered by a plastic sheet such as polyethylene, polystyrene and Teflon (R). Further the details of the pre-heating roller is referred to JP-A No. 64-80962.

The pre-heating in this invention is preferably performed at 70–180° C. for approximately 3–120 seconds.

(Developer Solution)

A photosensitive layer having been image-wise exposed is cured at the exposed portion. By developing this with an alkaline developer, the unexposed portion is removed to enable image formation. As such a developer, utilized can be conventionally known alkaline solutions. For example, listed are alkaline developers employing inorganic alkaline agents such as sodium silicate, potassium silicate, ammonium silicate; sodium phosphate, potassium phosphate, ammonium phosphate; sodium bicarbonate, potassium bicarbonate, ammonium bicarbonate; sodium carbonate, potassium carbonate, ammonium carbonate; sodium hydrogencarbonate, potassium hydrogencarbonate, ammonium hydrogencarbonate; sodium borate, potassium borate, ammonium borate; sodium hydroxide, potassium hydroxide, ammonium hydroxide and lithium hydroxide.

Further, utilized can be also organic alkaline agents such as monomethylamine, dimethylamine, trimethylamine, monoethylamine, diethylamine, triethylamine, mono-i-propylamine, di-i-propylamine, tri-i-propylamine, butylamine, monoethanolamine, diethanolamine, triethanolamine, mono-i-propanolamine, di-i-propanolamine, ethyleneimine, ethylenediamine and pyridine.

These alkaline agents are utilized alone or in combination of two or more types. Further, in the developer solution, can be appropriately added an anion surfactant, an amphoteric surfactant and organic solvents such as alcohol.

EXAMPLES

In the following, this invention is specifically explained in reference to examples, however, this invention is not limited thereto.

Example 1

<Polymer Binder: Synthesis of Acrylic Type Copolymer 1>

In a three-neck flask under nitrogen gas flow, charged were 30 parts of methacrylic acid, 50 parts of methyl methacrylate, 20 parts of ethyl methacrylate, 500 parts of isopropylalcohol and 3 parts of αα'-azobisisobutylonitrile, and were reacted in a oil bath of 80° C. under nitrogen gas flow for 6 hours. Then, after the system was refluxed at a boiling point of isopropylalcohol for an hour, 3 parts of triethylammonium chloride and 25 parts of glycidyl methacrylate were added to be reacted for 3 hours to prepare acrylic type copolymer 1. A weight average molecular weight measured by use of GPC was approximately 35,000, and a glass transition temperature (Tg) measured by use of DSC (Differential Thermal Analysis Method) was approximately 85° C.

[Preparation of Support]

The following treatments were performed successively utilizing JIS A 1050 aluminum plate having a thickness of 0.24 mm and a width of 1030 mm.

(a) Employing a conventional mechanical roughening device, mechanical roughening was performed by use of a rotating roller-shape nylon blush while supplying a suspension of an abrasive (pumice) having a specific gravity of 1.12 and water as a grinding slurry solution on the aluminum plate surface. An average particle diameter of an abrasive was 40–45 µm and the maximum particle diameter was 200 µm. As a material of a nylon blush, employed 6,10-nylon, and a fur length was 50 mm and a fur diameter was 0.3 mm. Nylon blush was comprised by planting furs at a high density on a stainless steel cylinder having a diameter of 300 mm on which holes having been punched for planting. Three rotating blushes were employed. The distance between the two support rollers (φ200 mm) under the blush was 300 mm. The blush roller was pressed onto an aluminum plate to make a load of 7 kW plus against the load before pressing, based on the load of a driving motor to rotate the blush. The rotation direction of the blush was same as that of aluminum plate transition, and a rotating rate was 200 rpm.

(b) An aluminum plate was subjected to an etching treatment at a caustic soda concentration of 2.6 weight % and an aluminum ion concentration of 6.5 weight %, by means of a spray at 70° C. to dissolve the aluminum plate by 0.3 g/m$^2$. Thereafter, the plate was washed by means of a water spray.

(c) A desmut treatment was performed by means of spray employing a nitric acid aqueous solution (containing aluminum ion of 0.5 weight % and ammonium ion of 0.007 weight %) having a concentration of 1 weight % at 30° C., followed by washing by a water spray. As the nitric acid aqueous solution employed for the aforesaid desmut treatment, utilized was a waste liquor from the process where electrolytic roughening was performed employing an alternating current in a nitric acid aqueous solution.

(d) Electrolytic roughening treatment was continuously performed by utilizing an alternating voltage of 60 Hz. In this case, an electrolytic solution was comprised of a hydrochloric acid or nitric acid aqueous solution (containing aluminum ion of 0.5 weight % and ammonium ion of 0.007 weight %) having concentrations shown in tables No. 1 and 2, and the temperature was 40° C. An electrolytic roughening treatment was performed at a time TP, when a current reaches from zero to the peak value, of 2 msec, at a duty ratio of 1/1, by use of a rectangular wave alternating current of a trapezoid, and employing a carbon electrode as a counter electrode. As a subsidiary anode utilized was comprised of ferrite. A current density was values expressed in table Nos. 1 and 2, and the immersion (electrolysis) time is also described in table Nos. 1 and 2.5% of a current from a power source is delivered to a subsidiary anode. Thereafter, a washing with water was performed by means of a spray.

(e) The aluminum plate was subjected to an etching treatment by means of a spray at an alkaline concentration of 26 weight % and an aluminum ion concentration of 6.5 weight % at 32° C., to dissolve 0.2 g/m² of the aluminum plate, and removed was smut component primary comprising sodium hydroxide, which had been formed in the previous electrolytic roughening by an alternating current, as well as dissolved the edge portion of the pit generated to result in smoothening of the edge portions. Thereafter, the plate was washed by a water spray.

(f) A desmut treatment by means of a spray was performed employing a sulfuric acid aqueous solution having a concentration of 25 weight % (containing aluminum ion of 0.5 weight %) at 60° C., and then washing was performed by use of a water spray.

(g) An anodic oxidation treatment was performed by use of a conventional anodic oxidation apparatus for a two-step power-supplied electrolysis method (each length of the first and second electrolysis section being 6 m, the first power supply section being 3 m long, the second power supply section being 3 m long, and each length of the first and second power supply electrode being 2.4 m) with a sulfuric acid concentration at the electrolysis section of 170 g/l (containing aluminum ion of 0.5 weight %) at 38° C. Thereafter, washing was performed by use of a water spray. At this time, in the anodic oxidation apparatus, an electric current from a power source flows to the first power supply electrode arranged in the first power supply section, then to plate-form aluminum through an electrolytic solution to generate an oxidized film on the surface of the plate form aluminum in the first electrolysis section, and goes through an electrolysis electrode arranged in the first power supply section to comes back to the power source. On the other hand, an electric current from a power source flows to the second power supply electrode arranged in the second power supply section, then similarly to plate-form aluminum through an electrolytic solution to generate an oxidized film on the surface of the plate form aluminum in the first electrolysis section; the quantity of electricity supplied from a power source to the first power supply section and the quantity of electricity supplied from a power source to the second power supply section are same, and an power supply electric current density on the oxidized film surface at the second power supply section was approximately 25 A/dm². In the second power supply section, power was supplied from the oxidized film surface of 1.35 g/m². The final amount of an oxidized film was 2.7 g/m². The aluminum plate contains 0.1 weight % of iron, 0.02 weight % of copper and 0.02 weight % of titanium. Further, after having been washed by use of a water spray, the plate was immersed in a polyvinyl phosphonic acid solution having a concentration of 0.3 weight % for 50 seconds to perform a treatment providing a hydrophilic property. The treatment temperature was 85° C. Thereafter, the plate was washed by use of a water spray, followed by being dried with an infrared heater. At this time, an average centerline roughness (Ra) of the surface was 0.65 μm.

(Preparation of Planographic Printing Plate)

Photo-polymerizing photosensitive layer coating solution 1 comprising the following composition was coated on the aforesaid support by use of a wire bar to make a dried solid of 1.5 g/m² followed by being dried at 95° C. for 1.5 minutes to prepare a photo-polymerizing photosensitive layer coated sample. Further, an oxygen-shielding layer coating solution comprising the following composition was coated on the photo-polymerizing photosensitive layer coated sample by use of a wire bar to make a dried solid of 1.8 g/m² followed by being dried at 75° C. for 1.5 minutes to prepare a photosensitive planographic printing plate sample provided with an oxygen-shielding layer on the photosensitive layer (shown in tables 1 and 2).

(Photo-polymerizing Photosensitive Layer Coating Solution 1)

| | |
|---|---:|
| Monomer containing an ethylenic double bond (NK Oligo U-4HA, manufactured by Shin-Nakamura Chemicals Industrial Co., Ltd.) | 27.0 parts |
| Monomer containing an ethylenic double bond (NK Ester 4G, manufactured by Shin-Nakamura Chemicals Industrial Co., Ltd.) | 14.0 parts |
| Spectral sensitizing dye (Dodecyl Eosine 1) | 3.0 parts |
| Fe-3 or Ti-1 | 4.0 parts |
| Acrylic type copolymer 1 | 45.0 parts |
| Phthalocyanine pigment (MH 1454, manufactured by Mikuni Dye Co., Ltd.) | 6.0 parts |
| 2-t-butyl-6-(3-t-butyl-2-hydroxy-5-methylbenzyl)-4-methylphenyl acrylate (Sumiriser GS, manufactured by Sumitomo 3M Limited) | 0.5 parts |
| Fluorine type surfactant (FC-4430, manufactured by Sumitomo 3M Limited) | 0.5 parts |
| Methyl ethyl ketone | 80 parts |
| Cyclohexanone | 820 parts |

Dodecyl Eosine 1

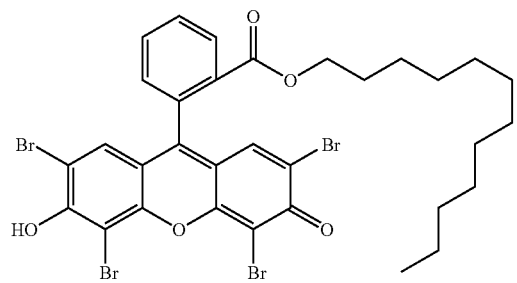

Dichloroacetophenone

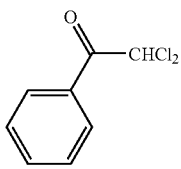

Triazine 1

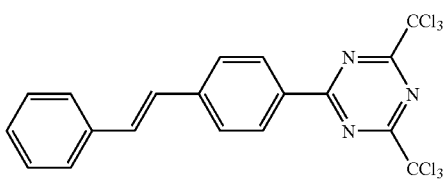

Triazine 2

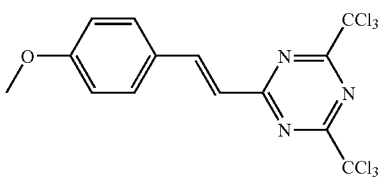

TCOD-1

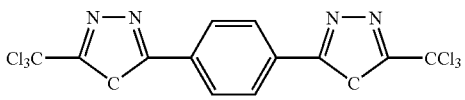

Ti-1

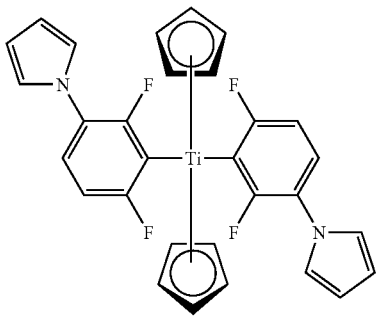

(Oxygen-Shielding Layer Coating Solution)

| | |
|---|---|
| Polyvinyl alcohol (GL-05, manufactured by Nippon Synthetic Chemical Industry Co., Ltd.) | 89 parts |
| Polyvinyl pyrrolidone (PVP K-30, manufactured by ISP Japan Co., Ltd.) | 10 parts |
| Surfactant (Surfinol 465, manufactured by Nisshin Chemicals Industrial Co., Ltd.) | 0.5 parts |
| Water | 900 parts |
| (Developer Composition) | |
| A potassium silicate | 8.0 weight parts |
| Newcol B-13SN (Nippon Emulsifier Co., Ltd.) | 2.0 weight parts |
| Pronon #204 (Nippon Fat and Oil Co., Ltd.) | 1.0 weight part |
| Causyic potash | addition amount to make a pH of 12.9 |

<Evaluation of Photosensitive Planographic Printing Plate>

(Evaluation of Printing Durability)

Exposure was performed at 400 dpi (dpi represents a number of dots per 2.54 cm) employing a plate setter (Tiger Cat, produced by ECRM Corp. ) equipped with a light source of 532 nm under the condition of making an exposure energy on the plate surface of 200 µJ/cm$^2$. After having been exposed, a photosensitive planographic printing plate was developed through a CTP automatic processor (PHW 23-V, produced by Technigraph Corp. ) being equipped with a pre-heat section to heat the plate at 105° C. for 10 seconds, a pre-washing section to remove an oxygen-shielding layer before development, a developing section filled with a developer comprising the following composition, a washing section to remove a developer solution adhered on the plate surface and a gum solution application section for image protection, resulting in preparation of a planographic printing plate.

Printing was performed with a planographic printing plate prepared on a printing machine (DAIYA 1F-1, produced by Mitsubishi Heavy Industrial Co., Ltd. ) employing coated paper, printing ink (Toyoking Highecho M rouge, manufactured by Toyo Ink Co., Ltd. ) and a dampening solution (H Solution SG-51 having a concentration of 1.5%, manufactured by Tokyo Ink Co., Ltd. ), and the plate surface was wiped with a cleaner after 1000 sheets of continuous printing. The printed sheet number, at which a dot loss in a highlight portion or an entanglement in a shadow portion was generated, was made to be a measure of printing durability. Printing durability 1 time indicates an operation to wipe with a cleaner after 1000 sheets continuous printing. It is the larger, the better. As a cleaner, utilized Ultra Plate Cleaner (available from Dainichi Seika Co., Ltd. ).

(Recovery from Smudge)

The plate was wiped with a cleaner after continuous printing of 1000 sheets, then printing was restarted after 15 minutes, determined was a sheet number where background smudge was diminished. It is the smaller, the better.

(Evaluation of Linearity)

A dot image of 175 lines and 2400 dpi was drawn at each 5% in a range of 0–100% without linearity correction. An output dot image to make 80% dot, when being exposed with an energy of 200 µJ/cm$^2$, was photographed through an optical microscope at 500 times magnification to measure an area of the image portion, which was defined as a screen percentage. It is the better, as near as 80%.

The evaluation results were shown in tables 1 and 2.

TABLE 1

| Sample No. | Type of acid | Concentration (weight %) | Current density (A/dm$^2$) | Immersion Time (sec) | Initiator | Printing durability (times) | Recovery from smudge (number of sheets) | Linearity (%) | Remarks |
|---|---|---|---|---|---|---|---|---|---|
| 0 | Hydrochloric acid | 1.0 | 60 | 20 | Ti-1 | 9 | 17 | 98 | Comp. |
| 1 | Hydrochloric acid | 0.2 | 100 | 120 | Fe-3 | 3 | 15 | 97 | Comp. |
| 2 | Hydrochloric acid | 0.2 | 20 | 7 | Fe-3 | 3 | 15 | 97 | Comp. |
| 3 | Hydrochloric acid | 0.4 | 20 | 60 | Fe-3 | 4 | 15 | 97 | Comp. |
| 4 | Hydrochloric acid | 1.0 | 20 | 60 | Fe-3 | 4 | 15 | 97 | Comp. |
| 5 | Hydrochloric acid | 2.8 | 20 | 60 | Fe-3 | 5 | 15 | 97 | Comp. |
| 6 | Hydrochloric acid | 3.2 | 100 | 20 | Fe-3 | 6 | 50 | 97 | Comp. |
| 7 | Hydrochloric acid | 3.2 | 20 | 120 | Fe-3 | 5 | 30 | 97 | Comp. |
| 8 | Hydrochloric acid | 0.4 | 30 | 20 | Fe-3 | 15 | 12 | 94 | Inv. |
| 9 | Hydrochloric acid | 0.4 | 60 | 20 | Fe-3 | 17 | 12 | 94 | Inv. |
| 10 | Hydrochloric acid | 0.4 | 100 | 20 | Fe-3 | 19 | 12 | 94 | Inv. |
| 11 | Hydrochloric acid | 0.4 | 100 | 120 | Fe-3 | 21 | 12 | 93 | Inv. |
| 12 | Hydrochloric acid | 1.0 | 30 | 20 | Fe-3 | 25 | 12 | 93 | Inv. |
| 13 | Hydrochloric acid | 1.0 | 60 | 20 | Fe-3 | 28 | 12 | 93 | Inv. |
| 14 | Hydrochloric acid | 1.0 | 100 | 20 | Fe-3 | 27 | 12 | 93 | Inv. |
| 15 | Hydrochloric acid | 2.8 | 30 | 20 | Fe-3 | 27 | 12 | 94 | Inv. |
| 16 | Hydrochloric acid | 2.8 | 60 | 20 | Fe-3 | 26 | 12 | 94 | Inv. |
| 17 | Hydrochloric acid | 2.8 | 100 | 20 | Fe-3 | 26 | 12 | 94 | Inv. |
| 18 | Hydrochloric acid | 2.8 | 100 | 120 | Fe-3 | 24 | 12 | 94 | Inv. |

Comp.: Comparison
Inv.: Invention

TABLE 2

| Sample No. | Type of acid | Concentration (weight %) | Current density (A/dm$^2$) | Immersion Time (sec) | Initiator | Printing durability (times) | Recovery from smudge (number of sheets) | Linearity (%) | Remarks |
|---|---|---|---|---|---|---|---|---|---|
| 19 | Nitric acid | 0.2 | 100 | 120 | Fe-3 | 1 | 15 | 97 | Comp. |
| 20 | Nitric acid | 0.2 | 20 | 7 | Fe-3 | 1 | 15 | 97 | Comp. |
| 21 | Nitric acid | 0.4 | 20 | 60 | Fe-3 | 2 | 15 | 97 | Comp. |
| 22 | Nitric acid | 1.0 | 20 | 60 | Fe-3 | 2 | 15 | 97 | Comp. |
| 23 | Nitric acid | 2.8 | 20 | 60 | Fe-3 | 3 | 15 | 97 | Comp. |
| 24 | Nitric acid | 3.2 | 100 | 20 | Fe-3 | 3 | 45 | 97 | Comp. |
| 25 | Nitric acid | 3.2 | 20 | 120 | Fe-3 | 3 | 35 | 97 | Comp. |
| 26 | Nitric acid | 0.4 | 30 | 20 | Fe-3 | 12 | 11 | 94 | Inv. |
| 27 | Nitric acid | 0.4 | 60 | 20 | Fe-3 | 12 | 11 | 94 | Inv. |
| 28 | Nitric acid | 0.4 | 100 | 20 | Fe-3 | 13 | 11 | 94 | Inv. |
| 29 | Nitric acid | 0.4 | 100 | 120 | Fe-3 | 14 | 11 | 93 | Inv. |
| 30 | Nitric acid | 1.0 | 30 | 20 | Fe-3 | 17 | 11 | 93 | Inv. |
| 31 | Nitric acid | 1.0 | 60 | 20 | Fe-3 | 19 | 11 | 93 | Inv. |
| 32 | Nitric acid | 1.0 | 100 | 20 | Fe-3 | 18 | 11 | 93 | Inv. |
| 33 | Nitric acid | 2.8 | 30 | 20 | Fe-3 | 17 | 11 | 94 | Inv. |
| 34 | Nitric acid | 2.8 | 60 | 20 | Fe-3 | 18 | 11 | 94 | Inv. |
| 35 | Nitric acid | 2.8 | 100 | 20 | Fe-3 | 17 | 11 | 94 | Inv. |
| 36 | Nitric acid | 2.8 | 100 | 120 | Fe-3 | 17 | 11 | 94 | Inv. |

Comp.: Comparison
Inv.: Invention

It is clear that samples of this invention are superior in printing durability, recovery from smudge as well as linearity.

Example 2

Example 2 was prepared in a similar manner to example 1, except that photo-polymerizing photosensitive layer coating solution 1 was replaced by 2.

(Photo-Polymerizing Photosensitive Layer Coating Solution 2)

| | |
|---|---|
| Monomer containing an ethylenic double bond (being shown in table 3: NK Oligo U-4HA, manufactured by Shin-Nakamura Chemicals Industrial Co., Ltd., or represented by general formula (1) or (2)) | 27.0 parts |
| Monomer containing an ethylenic double bond (NK Ester 4G, manufactured by Shin-Nakamura Chemicals Industrial Co., Ltd.) | 14.0 parts |
| Spectral sensitizing dye (Dodecyl Eosine 1) | 3.0 parts |
| Fe-3 | 4.0 parts |
| Acrylic type copolymer 1 | 45.0 parts |
| Phthalocyanine pigment (MH 1454, manufactured by Mlikuni Dye Co., Ltd.) | 6.0 parts |
| 2-t-butyl-6-(3-t-butyl-2-hydroxy-5-methylbenzyl)-4-methylphenyl acrylate (Sumiriser GS, manufactured by Sumitomo 3M Limited) | 0.5 parts |
| Fluorine type surfactant (FC-4430, manufactured by Sumitomo 3M Limited) | 0.5 parts |
| Methyl ethyl ketone | 80 parts |
| Cyclohexanone | 820 parts |

The evaluations were preformed in a similar manner to example 1. The results were shown in table 3.

It is clear that samples of this invention are superior in printing durability, recovery from smudge as well as linearity.

Example 3

Example 3 was prepared in a similar manner to example 1, except that photo-polymerizing photosensitive layer coating solution 1 was replaced by 3.

(Photo-Polymerizing Photosensitive Layer Coating Solution 3)

| | |
|---|---|
| Monomer containing an ethylenic double bond (being shown in tables 4 and 5: NK Oligo U-4HA, manufactured by Shin-Nakamura Chemicals Industrial Co., Ltd., or represented by general formula (1) or (2)) | 27.0 parts |
| Monomer containing an ethylenic double bond (NK Ester 4G, manufactured by Shin-Nakamura Chemicals Industrial Co., Ltd.) | 14.0 parts |
| Polyhalogen compound (being shown in tables 4 and 5) | 5.0 parts |
| Spectral sensitizing dye (Dodecyl Eosine 1) | 3.0 parts |
| Fe-3 | 4.0 parts |
| Acrylic type copolymer 1 | 45.0 parts |
| Phthalocyanine pigment (MH 1454, manufactured by Mikuni Dye Co., Ltd.) | 6.0 parts |
| 2-t-butyl-6-(3-t-butyl-2-hydroxy-5-methylbenzyl)-4-methylphenyl acrylate (Sumiriser GS, manufactured by Sumitomo 3M Limited) | 0.5 parts |
| Fluorine type surfactant (FC-4430, manufactured by Sumitomo 3M Limited) | 0.5 parts |
| Methyl ethyl ketone | 80 parts |
| Cyclohexanone | 820 parts |

The evaluations were preformed in a similar manner to example 1. The results were shown in tables 4 and 5.

TABLE 3

| Sample No. | Type of acid | Concentration (weight %) | Current density (A/dm$^2$) | Immersion time (sec) | General formula (1), (2) and others | Printing durability (times) | Recovery from smudge (number of sheets) | Linearity (%) | Remarks |
|---|---|---|---|---|---|---|---|---|---|
| 37 | Hydrochloric acid | 1.0 | 60 | 20 | (Sample No. 13) | 28 | 12 | 93 | Inv. |
| 38 | Hydrochloric acid | 1.0 | 60 | 20 | 1-13 | 35 | 13 | 90 | Inv. |
| 39 | Hydrochloric acid | 1.0 | 60 | 20 | 1-16 | 35 | 13 | 90 | Inv. |
| 40 | Hydrochloric acid | 1.0 | 60 | 20 | 1-17 | 35 | 12 | 90 | Inv. |
| 41 | Hydrochloric acid | 1.0 | 60 | 20 | 2-1 | 33 | 13 | 91 | Inv. |
| 42 | Hydrochloric acid | 1.0 | 60 | 20 | 2-5 | 33 | 13 | 91 | Inv. |
| 43 | Hydrochloric acid | 1.0 | 60 | 20 | 2-11 | 33 | 13 | 91 | Inv. |
| 44 | Nitric acid | 1.0 | 60 | 20 | (Sample No. 13) | 19 | 11 | 93 | Inv. |
| 45 | Nitric acid | 1.0 | 60 | 20 | 1-13 | 34 | 13 | 91 | Inv. |
| 46 | Nitric acid | 1.0 | 60 | 20 | 1-16 | 35 | 13 | 91 | Inv. |
| 47 | Nitric acid | 1.0 | 60 | 20 | 1-17 | 34 | 13 | 91 | Inv. |
| 48 | Nitric acid | 1.0 | 60 | 20 | 2-1 | 32 | 12 | 91 | Inv. |
| 49 | Nitric acid | 1.0 | 60 | 20 | 2-5 | 32 | 12 | 91 | Inv. |
| 50 | Nitric acid | 1.0 | 60 | 20 | 2-11 | 31 | 12 | 91 | Inv. |

Inv.: Invention

TABLE 4

| Sample No. | Type of acid | Concentration (weight %) | Current density (A/dm$^2$) | Immersion time (sec) | General formula (1), (2) and others | General formula (3)–(7) Polyhalogen compound | Printing durability (times) | *1 | *2 | Remark |
|---|---|---|---|---|---|---|---|---|---|---|
| 51 | Hydrochloric acid | 1.0 | 60 | 20 | (Sample No. 13 | — | 28 | 12 | 93 | Inv. |
| 52 | Hydrochloric acid | 1.0 | 60 | 20 | 1-16 | 3-4 | 55 | 13 | 91 | Inv. |
| 53 | Hydrochloric acid | 1.0 | 60 | 20 | 1-16 | 3-14 | 55 | 13 | 91 | Inv. |
| 54 | Hydrochloric acid | 1.0 | 60 | 20 | 1-16 | 4-1 | 57 | 13 | 91 | Inv. |
| 55 | Hydrochloric acid | 1.0 | 60 | 20 | 1-16 | 4-2 | 53 | 13 | 91 | Inv. |
| 56 | Hydrochloric acid | 1.0 | 60 | 20 | 1-16 | 4-9 | 54 | 13 | 91 | Inv. |
| 57 | Hydrochloric acid | 1.0 | 60 | 20 | 1-16 | 5-1 | 52 | 13 | 91 | Inv. |
| 58 | Hydrochloric acid | 1.0 | 60 | 20 | 1-16 | 5-4 | 52 | 13 | 91 | Inv. |
| 59 | Hydrochloric acid | 1.0 | 60 | 20 | 1-16 | 5-11 | 50 | 13 | 91 | Inv. |
| 60 | Hydrochloric acid | 1.0 | 60 | 20 | 1-16 | BR22 | 70 | 13 | 88 | Inv. |
| 61 | Hydrochloric acid | 1.0 | 60 | 20 | 1-16 | BR43 | 70 | 13 | 88 | Inv. |
| 62 | Hydrochloric acid | 1.0 | 60 | 20 | 1-16 | BR67 | 60 | 13 | 89 | Inv. |
| 63 | Hydrochloric acid | 1.0 | 60 | 20 | 1-16 | BR68 | 60 | 13 | 89 | Inv. |
| 64 | Hydrochloric acid | 1.0 | 60 | 20 | 1-16 | Triazine 1 | 60 | 13 | 89 | Inv. |
| 65 | Hydrochloric acid | 1.0 | 60 | 20 | 1-16 | Triazine 2 | 60 | 13 | 89 | Inv. |
| 66 | Hydrochloric acid | 1.0 | 60 | 20 | 1-16 | TCOD-1 | 63 | 13 | 90 | Inv. |
| 67 | Hydrochloric acid | 1.0 | 60 | 20 | 1-16 | Cycloaceto-phenone | 63 | 13 | 90 | Inv. |
| 68 | Hydrochloric acid | 1.0 | 60 | 20 | 1-16 | BR63 | 60 | 13 | 90 | Inv. |

*1: Recovery from smudge (number of sheets)
*2: Linearity(%)
Inv.: Invention

TABLE 5

| Sample No. | Type of acid | Concentration (weight %) | Current density (A/dm$^2$) | Immersion time (sec) | General formula (1), (2) and others | General formula (3)–(7) Polyhalogen compound | Printing durability (times) | Recovery from smudge (number of sheets) | Linearity (%) | Remark |
|---|---|---|---|---|---|---|---|---|---|---|
| 69 | Nitric acid | 1.0 | 60 | 20 | (Sample No. 31) | — | 19 | 11 | 93 | Inv. |
| 70 | Nitric acid | 1.0 | 60 | 20 | 1-16 | 3-4 | 53 | 13 | 91 | Inv. |
| 71 | Nitric acid | 1.0 | 60 | 20 | 1-16 | 3-14 | 51 | 13 | 91 | Inv. |
| 72 | Nitric acid | 1.0 | 60 | 20 | 1-16 | 4-1 | 50 | 13 | 91 | Inv. |
| 73 | Nitric acid | 1.0 | 60 | 20 | 1-16 | 4-2 | 51 | 13 | 91 | Inv. |
| 74 | Nitric acid | 1.0 | 60 | 20 | 1-16 | 4-9 | 51 | 13 | 91 | Inv. |
| 75 | Nitric acid | 1.0 | 60 | 20 | 1-16 | 5-1 | 53 | 13 | 91 | Inv. |
| 76 | Nitric acid | 1.0 | 60 | 20 | 1-16 | 5-4 | 51 | 13 | 91 | Inv. |
| 77 | Nitric acid | 1.0 | 60 | 20 | 1-16 | 5-11 | 49 | 13 | 91 | Inv. |
| 78 | Nitric acid | 1.0 | 60 | 20 | 1-16 | BR22 | 66 | 13 | 89 | Inv. |
| 79 | Nitric acid | 1.0 | 60 | 20 | 1-16 | BR43 | 66 | 13 | 89 | Inv. |
| 80 | Nitric acid | 1.0 | 60 | 20 | 1-16 | BR67 | 55 | 13 | 90 | Inv. |
| 81 | Nitric acid | 1.0 | 60 | 20 | 1-16 | BR68 | 55 | 13 | 90 | Inv. |
| 82 | Nitric acid | 1.0 | 60 | 20 | 1-16 | Triazine 1 | 55 | 13 | 90 | Inv. |
| 83 | Nitric acid | 1.0 | 60 | 20 | 1-16 | Triazine 2 | 55 | 13 | 90 | Inv. |
| 84 | Nitric acid | 1.0 | 60 | 20 | 1-16 | TCOD-1 | 58 | 13 | 91 | Inv. |
| 85 | Nitric acid | 1.0 | 60 | 20 | 1-16 | Cycloaceto-phenone | 58 | 13 | 91 | Inv. |
| 86 | Nitric acid | 1.0 | 60 | 20 | 1-16 | BR63 | 55 | 13 | 91 | Inv. |

Inv.: Invention

It is clear that samples of this invention are superior in printing durability, recovery from smudge as well as linearity.

Example 4

Example 4 was prepared in a similar manner to example 1, except that photo-polymerizing photosensitive layer coating solution 1 was replaced by 4 and that the exposure wavelength (an exposing device) was changed.

(Photo-Polymerizing Photosensitive Layer Coating Solution 4)

| | |
|---|---|
| Monomer containing an ethylenic double bond (being shown in table 6: NK Oligo U-4HA, manufactured by Shin-Nakamura Chemicals Industrial Co., Ltd., or represented by general formula (1) or (2)) | 27.0 parts |
| Monomer containing an ethylenic double bond (NK Ester 4G, manufactured by Shin-Nakamura Chemicals Industrial Co., Ltd.) | 14.0 parts |
| Polyhalogen compound (being shown in tables 6) | 5.0 parts |
| Dye (being shown in table 6) | 3.0 parts |
| Iron arene complex compound (being shown in table 6) | 4.0 parts |

-continued

| | |
|---|---|
| Acrylic type copolymer 1 | 40.0 parts |
| Phthalocyanine pigment (MH 1454, manufactured by Mikuni Dye Co., Ltd.) | 6.0 parts |
| 2-t-butyl-6-(3-t-butyl-2-hydroxy-5-methylbenzyl)-4-methylphenyl acrylate (Sumiriser GS, manufactured by Sumitomo 3M Limited) | 0.5 parts |
| Fluorine type surfactant (FC-4430, manufactured by Sumitomo 3M Limited) | 0.5 parts |
| Methyl ethyl ketone | 80 parts |
| Cyclohexanone | 820 parts |

Exposure was performed employing Blue Dolphine, produced by ECRM Corp. equipped with a laser diode of 30 mW and 405 nm instead of Tiger Cat (produced by ECRM Corp. ).

The evaluations were preformed in similar manner to example 1. The results were shown in tables 6.

TABLE 6

| Sample No. | Type of acid | Concentration (weight %) | Current density (A/dm$^2$) | Immersion time (sec) | Iron allene complex compound | General formula (1), (2) | General formula (3)–(7) Polyhalogen compound | Dye | *1 | *2 | *3 | Remark |
|---|---|---|---|---|---|---|---|---|---|---|---|---|
| 87 | Hydrochloric acid | 1.0 | 60 | 20 | Fe-3 | 1-15 | BR22 | *4 | 70 | 13 | 88 | Inv. |
| 88 | Hydrochloric acid | 1.0 | 60 | 20 | Fe-3 | 1-16 | BR22 | 8-1 | 78 | 12 | 86 | Inv. |
| 89 | Hydrochloric acid | 1.0 | 60 | 20 | Fe-3 | 1-16 | BR22 | 9-1 | 76 | 12 | 86 | Inv. |
| 90 | Hydrochloric acid | 1.0 | 60 | 20 | Fe-3 | 1-16 | BR22 | 10-4 | 76 | 12 | 86 | Inv. |
| 91 | Hydrochloric acid | 1.0 | 60 | 20 | Fe-3 | 1-16 | BR22 | 11-4 | 77 | 12 | 86 | Inv. |
| 92 | Nitric acid | 1.0 | 60 | 20 | Fe-3 | 1-16 | BR22 | *4 | 66 | 12 | 89 | Inv. |
| 93 | Nitric acid | 1.0 | 60 | 20 | Fe-3 | 1-16 | BR22 | 8-1 | 75 | 12 | 87 | Inv. |
| 94 | Nitric acid | 1.0 | 60 | 20 | Fe-3 | 1-16 | BR22 | 9-1 | 75 | 12 | 87 | Inv. |
| 95 | Nitric acid | 1.0 | 60 | 20 | Fe-3 | 1-16 | BR22 | 10-4 | 75 | 12 | 87 | Inv. |
| 96 | Nitric acid | 1.0 | 60 | 20 | Fe-3 | 1-16 | BR22 | 11-4 | 74 | 12 | 87 | Inv. |
| 97 | Hydrochloric acid | 1.0 | 60 | 20 | Fe-6 | 1-16 | BR22 | 8-1 | 74 | 12 | 86 | Inv. |
| 98 | Hydrochloric acid | 1.0 | 60 | 20 | Fe-7 | 1-16 | BR22 | 8-1 | 73 | 12 | 86 | Inv. |
| 99 | Hydrochloric acid | 1.0 | 60 | 20 | Fe-11 | 1-16 | BR22 | 8-1 | 74 | 12 | 86 | Inv. |
| 100 | Hydrochloric acid | 1.0 | 60 | 20 | Fe-16 | 1-16 | BR22 | 8-1 | 73 | 12 | 86 | Inv. |

*1; Printing durability(times)
*2; Recovery from smudge (number of sheets)
*3; Linearity (%)
*4; Dodecyl Eosine 1
Inv.; Invention It is clear that samples of this invention are superior in printing durability, recovery from smudge as well as linearity.

This invention has been able to provide a photosensitive composition and a photosensitive planographic printing plate which exhibit superior printing durability as well as excellent linearity.

What is claimed is:

1. A method for producing a photosensitive planographic printing plate comprising:
   (i) carrying out electrolysis to an aluminum support in an aqueous solution of hydrochloric acid or nitric acid so as to provide the aluminum support with a roughened surface;
   (ii) coating a photosensitive composition on the roughened surface of the aluminum support to obtain a photosensitive layer, the photosensitive composition containing:
      (A) a monomer having an ethylenic double bond which is also polymerizable;
      (B) a photoinitiator composition containing an iron arene complex compound; and
      (C) a polymer binder,
   (iii) drying the photosensitive layer,
   wherein a content of hydrochloric acid or nitric acid in the aqueous solution for electrolysis is 0.4 to 2.8 weight % based on the total weight of the aqueous solution;
   an electric current density applied during electrolysis is 30 to 100 A/dm$^2$;
   and a time period for electrolysis is 10 to 120 seconds;
   and the photoinitiator composition contains a dye having a maximum absorption in a range of 350–600 nm.

2. The method for producing a photosensitive planographic printing plate of claim 1, wherein the monomer in the photosensitive composition is represented by General Formula (1) or General Formula (2):

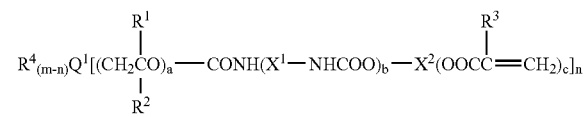

General formula (1)

wherein, $Q^1$ is selected from the group consisting of:

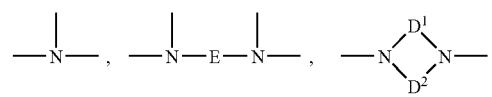

and —S—; $R^4$ is an alkyl group, a hydroxyalkyl group or an aryl group; each $R^1$ and $R^2$ is independently a hydrogen atom, an alkyl group or an alkoxyalkyl group; $R^3$ is a hydrogen atom, a methyl group or an ethyl group; $X^1$ is a divalent linkage group having 2–12 carbon atoms; $X^2$ is a divalent, trivalent or tetravalent linkage group or

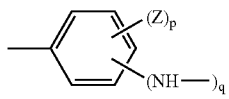

Z is an alkyl group, an alkenyl group, an aryl group, a halogen atom, an alkoxyl group or a heterocyclic group; p is an integer of 1 to 4; q is an integer of 1 to 3, provided that p+q≦5; each $D^1$ and $D^2$ is independently a saturated hydrocarbon group having 1 to 5 carbon atoms; E is a saturated hydrocarbon group having 2 to 12 carbon atoms, an alicyclic compound of a 5 to 7 membered ring, provided that the ring contains at most two hetero atoms of N, O or S atom as a ring member, an aromatic group having 6 to 12 carbon atoms, or a heterocyclic aromatic compound having a 5 or 6 membered ring; a is an integer of 0 to 4; b is an integer of 0 or 1; c is an integer of 1 to 3; m is an integer of 2 to 4 which is variable depending on a valence of $Q^1$; n is an integer of 1 to m;

General Formula (2)

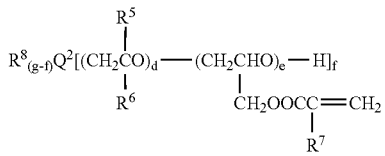

wherein, $Q^1$ is selected from the group consisting of

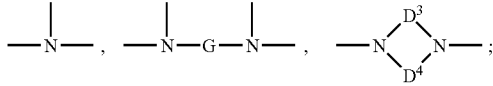

$R_8$ is an alkyl group, a hydroxyalkyl group or an aryl group; each $R^5$ and $R^6$ is independently a hydrogen atom, an alkyl group or an alkoxyalkyl group; $R^7$ is a hydrogen atom, a methyl group or an ethyl group; each $D^3$ and $D^4$ is independently a saturated hydrocarbon group having 1 to 5 carbon atoms; G is a saturated hydrocarbon group having 2 to 12 carbon atoms, an alicyclic compound of a 5 to 7 membered ring provided that the ring contains at most two hetero atoms of N, O or S atom as a ring member, an aromatic group having 6 to 12 carbon atoms, or heterocyclic aromatic group of a 5 or 6 membered ring; each d and e is independently an integer of 1 to 4; g is an integer of 2 to 4 which is variable depending on a valence of $Q^1$; and f is an integer of 1–g.

3. The method for producing a photosensitive planographic printing plate of claim 1, wherein the photoinitiator composition in the photosensitive composition contains a polyhalogen compound.

4. The method for producing a photosensitive planographic printing plate of claim 3, wherein the polyhalogen compound is selected from the group consisting of polyhaloacetylamide compounds, polyhalotriazine compounds and compounds represented by General Formulas (3)–(5):

General Formula (3)

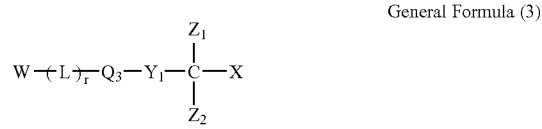

wherein, each $Z^1$ and $Z^2$ is independently a halogen atom; X is a hydrogen atom or an electron withdrawing group; $Y_1$, is —CO— or —$SO_2$—; $Q_3$ is an arylene group or a divalent heterocyclic group; L is a linkage group; W is a carboxyl group or a salt thereof, a sulfo group or a salt thereof, a hydroxyl group, a quaternary ammonium group or a polyethylene oxy group; and r is an integer of 0 or 1;

General Formula (4)

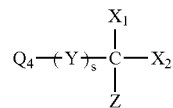

wherein, $Q_4$ is an alkyl group, an aryl group or a heterocyclic group; each $X_1$ and $X_2$ is independently a halogen atom; Z is a hydrogen atom or an electron withdrawing group; Y is —C(=O)—, —SO— or —$SO_2$—; and s is an integer of 0 or 1;

General Formula (5)

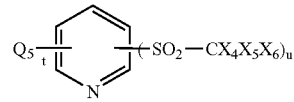

wherein, $Q_5$ is an alkyl group, an aryl group or a heterocyclic group; each $X_4$, $X_5$ and $X_6$ is independently a hydrogen atom or a halogen atom, provided that at least one of $X_4$, $X_5$ and $X_6$ is a halogen atom; t is an integer of 0 to 4; and u is an integer of 1 to 5.5.

5. A photosensitive planographic printing plate comprising an aluminum support having thereon a photosensitive layer containing:
   (A) a monomer having an ethylenic double bond which is also polymerizable;
   (B) a photoinitiator composition containing an iron arene complex compound; and
   (C) a polymer binder,
   wherein the aluminum support has a roughened surface which is provided by electrolysis in an aqueous solution of hydrochloric acid or nitric acid; a content of hydrochloric acid or nitric acid in the aqueous solution for electrolysis is 0.4 to 2.8 weight % based on the total weight of each aqueous solution; an electric current density applied during electrolysis is 30 to 100 A/dm²; and a time period for electrolysis is 10 to 120 seconds.

* * * * *